(12) United States Patent  
Nguyen et al.

(10) Patent No.: US 9,281,426 B2  
(45) Date of Patent: Mar. 8, 2016

(54) SYSTEMS, DEVICES, AND/OR METHODS FOR SOLAR CELLS COMPRISING A LIGHT AMPLIFICATION ELEMENT

(71) Applicant: K TUBE TECHNOLOGY LLC, San Jose, CA (US)

(72) Inventors: Khe C Nguyen, Ho Chi Minh (VN); Hieu Dinh, San Jose, CA (US)

( * ) Notice: Subject to any disclaimer, the term of this patent is extended or adjusted under 35 U.S.C. 154(b) by 137 days.

(21) Appl. No.: 13/261,960

(22) PCT Filed: Sep. 30, 2012

(86) PCT No.: PCT/US2012/058191  
§ 371 (c)(1),  
(2) Date: May 6, 2014

(87) PCT Pub. No.: WO2013/070339  
PCT Pub. Date: May 16, 2013

(65) Prior Publication Data  
US 2015/0083973 A1  Mar. 26, 2015

Related U.S. Application Data

(63) Continuation-in-part of application No. 13/290,108, filed on Nov. 7, 2011, now abandoned, which is a continuation-in-part of application No. 13/331,330, filed on Dec. 20, 2011, now abandoned.

(51) Int. Cl.

| | |
|---|---|
| H01L 31/0256 | (2006.01) |
| H01L 51/42 | (2006.01) |
| C01B 31/04 | (2006.01) |
| H01M 8/02 | (2006.01) |
| B82Y 30/00 | (2011.01) |
| B82Y 40/00 | (2011.01) |
| H01L 51/00 | (2006.01) |
| B82Y 10/00 | (2011.01) |

(52) U.S. Cl.  
CPC ........ *H01L 31/0256* (2013.01); *C01B 31/0453* (2013.01); *H01L 51/422* (2013.01); *H01M 8/0232* (2013.01); *B82Y 10/00* (2013.01); *B82Y 30/00* (2013.01); *B82Y 40/00* (2013.01); *H01L 51/0048* (2013.01); *H01L 51/0053* (2013.01); *H01L 51/0086* (2013.01); *H01L 2031/0344* (2013.01); *H01L 2251/308* (2013.01); *Y02E 10/549* (2013.01); *Y02E 60/50* (2013.01); *Y02P 70/521* (2015.11)

(58) Field of Classification Search  
CPC ............ H01M 8/0232; H01L 31/0256; H01L 51/0048; H01L 51/0053; H01L 51/422; H01L 2031/0344; H01L 2251/308; C01B 31/0453; Y02E 10/549; Y02P 70/521; B82Y 40/00; B82Y 30/40  
See application file for complete search history.

(56) References Cited

U.S. PATENT DOCUMENTS 5,278,785 A * 1/1994 Hazani ............. H01L 27/11521  
257/E21.682  
2012/0205518 A1* 8/2012 Voutilainen ............. G01J 3/513  
250/200

OTHER PUBLICATIONS

Ni et al. [Ni] (Nano Letters 2007 vol. 7 No. 9 pp. 2758-2763).*

*Primary Examiner* — Patrick Ryan  
*Assistant Examiner* — Aaron Greso  
(74) *Attorney, Agent, or Firm* — Dale Jensen, PLC; Dale R. Jensen

(57) ABSTRACT

Certain exemplary embodiments can provide a method, which can comprise fabricating a system. The system can comprise a light amplification element and a charge transport element. Each of the light amplification element and a charge transport element can comprise one or more of a graphene layer, graphene oxide, graphene nano platelets, functionalized graphene, graphene/superconductor composite, tubular shaped nano carbon, semiconductor powder, thin film, nano wire, and nano rod.

19 Claims, 23 Drawing Sheets

10000

11000

Model 2

SYSTEMS, DEVICES, AND/OR METHODS FOR SOLAR CELLS COMPRISING A LIGHT AMPLIFICATION ELEMENT

This application is a continuation in part of, and claims priority to, pending U.S. patent application Ser. No. 13/290,108, filed 6 Nov. 2011 and pending U.S. patent application Ser. No. 13/331,330, filed 20 Dec. 2011.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DETAILED DESCRIPTION

Figure 1:
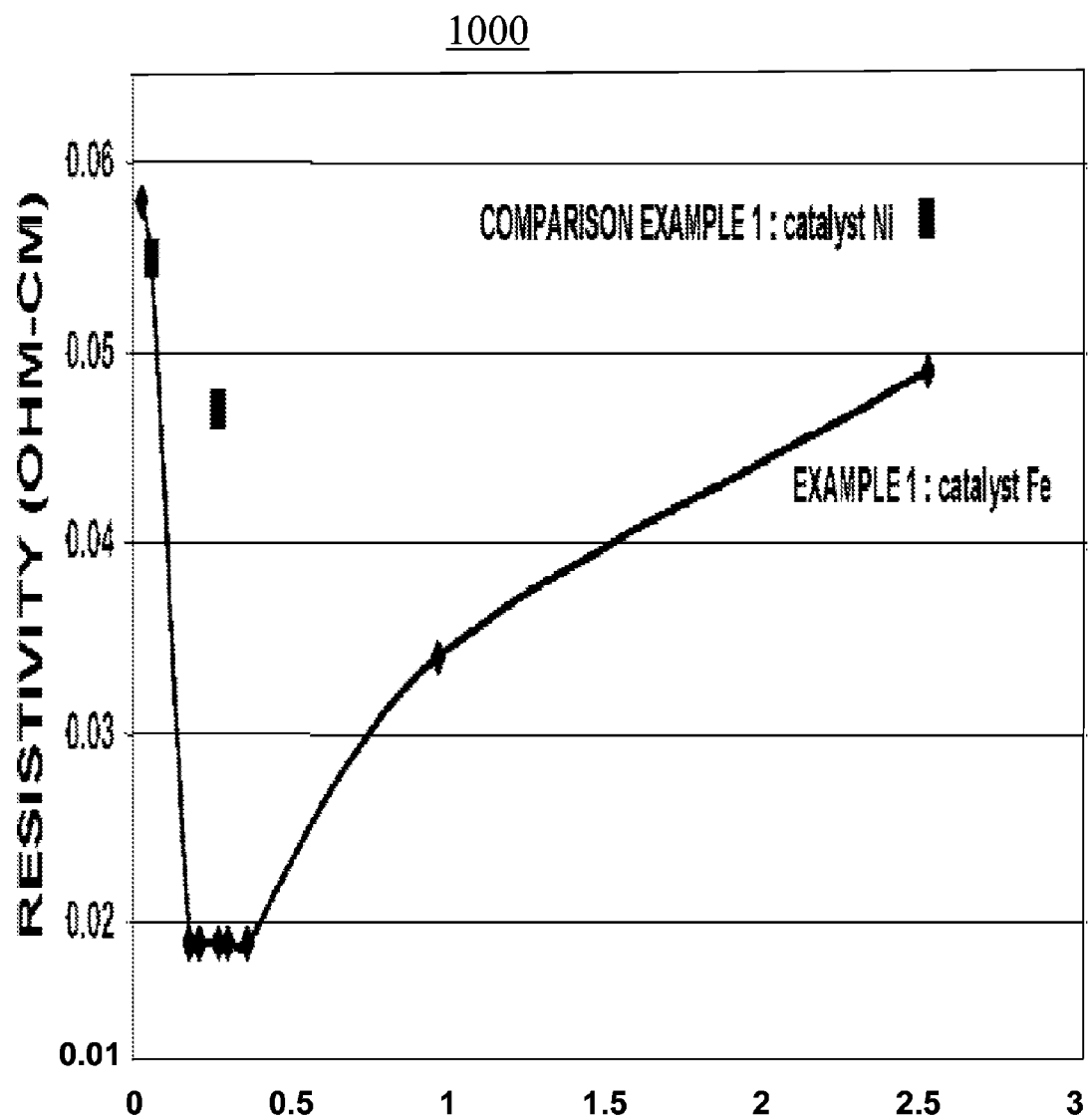
FIG. 1 is a graph 1000 of resistivity values for pyrolysis products of exemplary embodiments.

Certain exemplary embodiments provide a method, which can comprise fabricating a system. The system can comprise an amplification element. The amplification element can comprise a light induced physical change element, light induced chemical change element, charge generation element, and/or a charge transport element, etc. Each of the light amplification element, charge generation element, and charge transport element can comprise one or more of a graphene layer, graphene oxide, graphene nano platelets, graphene/superconductor composite, functionalized graphene, tubular shaped nano carbon, semiconductor powder, thin film, nano crystalline, nano wire, and/or nano rod, etc.

In photoconductor technology and/or solar cell technology, light induces physical and/or chemical changes to substances. Solar cells (also called photovoltaic cells and/or photoelectric cells) are solid state electrical devices that convert the energy of light directly into electricity via the photovoltaic effect. Solar cells can be electrically connected and/or encapsulated as modules. Photovoltaic modules can have a sheet of glass on the front (sun up) side, allowing light to pass while shielding the semiconductor wafers from abrasion and impact due to wind-driven debris, rain, and/or hail, etc. Solar cells can be connected in series in modules, creating an additive voltage. Connecting cells in parallel yields a higher current; however, some problems can exist with parallel connections. Certain embodiments can use a thin-film cell sandwiched between two layers of glass. Silicon panels can have relatively low prices. By late 2011, relatively efficient production, coupled with a drop in European demand has dropped prices for crystalline solar-based modules to approximately $1.09 per watt in October 2011, down sharply from the price per watt in 2010.

Solar cell technology can have a relatively low efficiency, such as, approximately 15% for Silicon ("Si"), approximately 40% for gallium arsenide ("GaAs"), and between approximately 2-10% for polymer type solar cells. Material costs for solar cells can be relatively high (e.g., for gas, single crystal Si, amorphous Si, and/or silicon-germanium, etc.). Solar cell technology can have a relatively high toxicity due to substances such as cadmium indium gallium selenide ("CIGS"), cadmium telluride ("CdTe"), cadmium sulfide ("CdS"), and/or cadmium selenide ("CdSe"). Solar cells can be relatively difficult to manufacture into large dimension to capture a lot of sun light energy. Certain exemplary embodiments provide a solar cell with a relatively high efficiency, relatively low cost, and relatively safe materials for both manufacturers and end users.

Certain exemplary embodiments can comprise graphene and/or graphene related structures such as graphene nano platelets, and/or a graphene hybrid composite, as is disclosed in related U.S. patent application Ser. No. 13/290,108, functionalized graphene and the like.

Graphene is an allotrope of carbon, whose structure is substantially one-atom-thick substantially planar sheets of sp2-bonded carbon atoms that are densely packed in a honeycomb crystal lattice. Graphene is considered as the raw material which can roll up into carbon nano tubes and/or be rearranged into buckyballs. Graphene can have a relatively high mobility in the range of approximately 20,000 square centimeters per volt second ("cm2/V sec"), which is superior to other high mobility materials such as GaAs (8500 cm2/V sec).

In order to use graphene as a charge transport element, graphene layer thickness can be between approximately 0.1 nanometer ("nm") up to approximately 50 microns; i.e., the thickness of graphene layer can be dependent on the number of the layers deposited onto each other. When graphene layers are stacked up into multiple layers, the charge mobility between layers slows down due to the interlayer gap. Interlayer gap distance can be reduced by increasing reaction chamber vacuum. A count of layers in a stack can be increased responsive to an increase in reaction time.

In order to use graphene as a charge generation element, graphene itself must be prepared to have band gap energy greater than zero by using a gas mix of various kinds of hydrocarbon and/or carbon sources carrying hetero atoms and/or specific functional groups. Functionalizing graphene can carry various functional groups and its thickness can be between approximately 0.1 nanometer ("nm") up to approximately 50 microns.

Charge transporting graphene layers can also be prepared by embedding small graphene flakes or hybrid graphene composite (disclosed in related U.S. patent application Ser. No. 13/290,108) into an insulating polymeric binder via a milling technique such as via a ball mill, paint shaker, and/or ultrasound, etc. In the related disclosure of U.S. patent application Ser. No. 13/290,108, there are some hybrid composites of graphene that exhibit relatively high electrical conductivity. These hybrid composites can be used for charge transport element formation.

Figure 5:
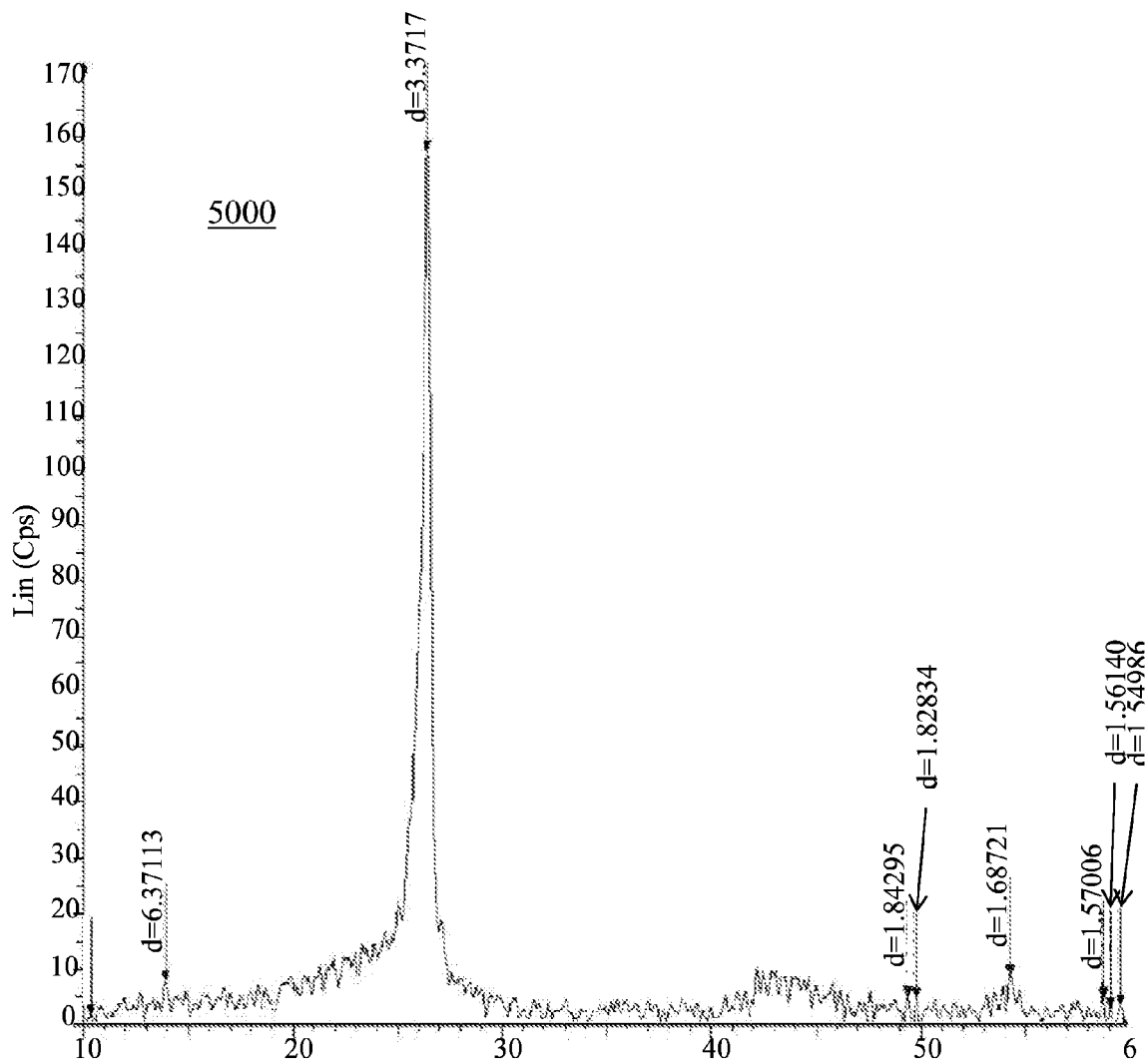
FIG. 5 is a graph 5000 of X-ray diffraction ("XRD") results for an exemplary pyrolysis product according to an exemplary embodiment.
Figure 6:
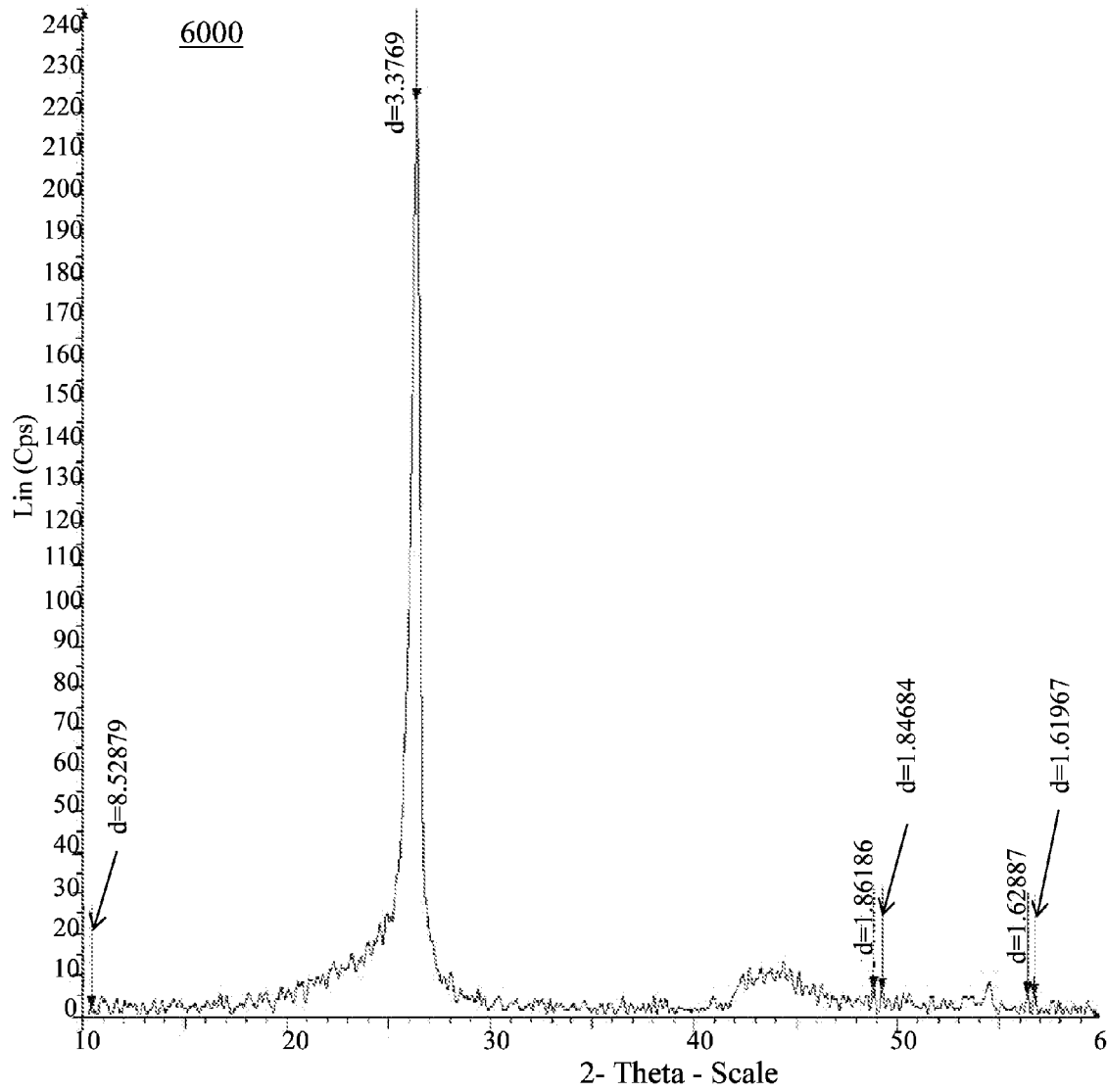
FIG. 6 is a graph 6000 of X-ray diffraction ("XRD") results for an exemplary pyrolysis product according to an exemplary embodiment.

Certain exemplary embodiments can provide a charge injection from an amplification layer into a graphene layer, which significantly enhances the conversion efficiency from light into electricity. These materials can be configured as follows:

silver can be used to make materials light sensitive, such as for photography. silver halides ("AgX"), silver sulfide ("$Ag_2S$"), silver selenide ("$Ag_2Se$"), and/or silver nitrate ("$AgNO_3$") can be ionized by light to give rise to $Ag+$, $X^-$, $S^{2-}$, and/or $Se^{2-}$ and electrons. A graphene layer can be prepared by thermal decomposition of a hydrocarbon gas such as methane, ("$CH_4$") and/or methanol ("$CH_3OH$") in a vacuum tube of via chemical vapor deposition in the presence of a conducting glass substrate made out of copper ("Cu") and/or nickel ("Ni"). Free radicals of carbon form a substantially planar sheet of carbon into a graphene layer on a surface of conductive glass. A graphene layer, as deposited, might not show light induced changes in physical properties such as forming free electrons useful for electrical signals. Light induced changes in the graphene layer can be facilitated by adding one or more of AgX, $Ag_2S$, $Ag_2Se$, AgNO3, other silver salts, and/or silver derivatives such as, but not limited to, potassium argentocyanide, rubidium silver iodide, silver acetate, silver acetylide, silver azide, silver behenate, silver bromate, silver carbonate, silver chlorate, silver chromate, silver cyanide, silver fulminate, silver hexafluorophosphate, silver iodate, silver molybdate, silver nitride, silver oxalate, silver oxide, silver perchlorate, silver phosphate, silver subfluoride, silver sulfadiazine, silver sulfate, silver telluride, silver tetrafluoroborate, and/or silver trifluoromethanesulfonate, etc. Such can be deposited directly onto the surface of graphene; and the composite of graphene with a silver derivative can be intercalated between two electrodes, in which one electrode can be transparent to allow light transmission therethrough. Even though silver compounds are light sensitive, there were no electrical signals observed when a particular embodiment of the composite was exposed to light. In order to enhance the photo-induced electrical signals, the silver compound can be mixed with another additive, which can convert ion $Ag^-$ into neutral $Ag^o$, thereby generating a free electron, effectively injected into graphene and transported through graphene layer to reach the electrode. There are several ways to improve the light induced electrical signals in the graphene/silver derivatives composite:

a silver derivative material can be embedded in a polymer comprising a —CONH functional group, such as a gelatin, polyamino acid, polyamide, polyurethane, polyimide, and/or emulsion polymer(s) etc.;

a silver material layer works as light absorber and can be mixed with a reducing agent and/or oxidizing agent;

smaller silver derivative particles can improve efficiency, thus the silver derivatives can be made out from nano silver solution then converted into nano silver derivatives such as silver halides, silver sulfides, and/or silver selenides, etc.;

silver compounds absorb light in the ultraviolet spectral area and are less sensitive to the visible light. Thus, a visible light absorbing dye can be added into silver compound and embedded into a polymer to form a visible light absorbing layer. For solar cell application, certain exemplary embodiments can utilize sensitizing dyes to absorb at approximately 517 nm where sun light power becomes strongest. These dyes can be Rose Bengal, N719, black dyes, rhodamine B, malachite green, crystal violet, cyanine, merocyanine dyes and/or any dyes useful in photographic systems, etc.;

the additives added to the light absorbing layer have a function of amplifying the number of photoelectrons generated by the light absorbing materials. The amplification mechanism can occur in either of two different methods:

the first method is similar to photographic processes; the photoelectron can be multiplied (Model 1—illustrated in FIG. 5); and in the second method, the photo reaction generates an electron, which can be repeated multiple times (Model 2—illustrated in FIG. 6).

In Model 1 and Model 2, M is a metal, H is hydrogen, R is a compound comprising one or more of Cl, Br, I, F, alkyl, alkenes, phenyl, aryl, alkenyl, and arylalkane; the arylalkane can comprise at least one substitute group selected from OH, —SH, —COOH, —NO_2, —CN, —SO_3H, —NR1R2, —CH2OH, —SO2, and —SO2Cl; where R1 and R2 are compounds comprising one or more of Cl, Br, I, F, alkyl, alkenes, phenyl, aryl, alkenyl, and arylalkane; the arylalkane comprising at least one substitute group. Model 1 can be useful for silver derivative systems and model 2 can be useful for light induced protonation.

Figure 18:
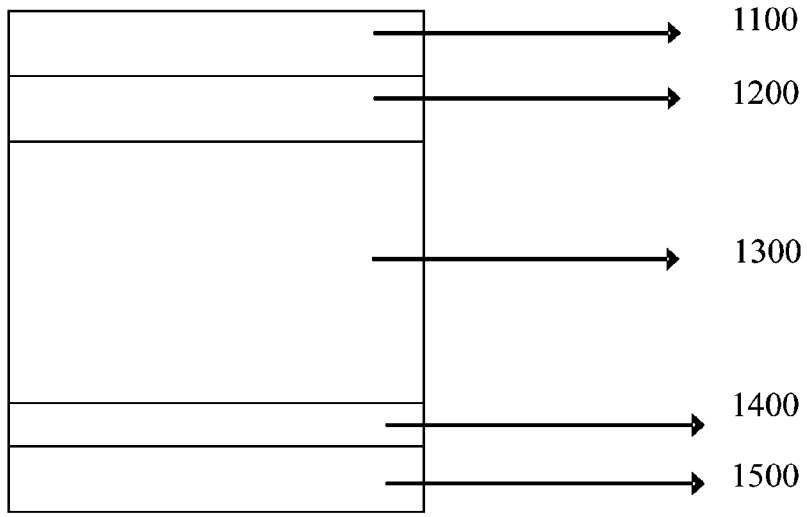
FIG. 18 is a block diagram of an exemplary embodiment of a system 18000.
Figure 18:
Figure 18:
Figure 18:

FIG. 18 is a block diagram of an exemplary embodiment of a system 18000, which can comprise a conductor 18100, a light amplification element 18200, a graphene layer 18300, a transparent conductor 18400, and a glass substrate 18500. Transparent conductor 18400 can comprise copper and/or nickel. An amplification process can occur in a solar cell comprising system 18000. Graphene layer 18300 can function as a charge transport element and light amplification element 18200 can comprise silver halide. Light amplification element 18200 can comprise at least one of a light induced physical change element and a light-induced chemical change element. Each of light amplification element 18200 and graphene layer 18300, which can be a charge transport element, can comprise one or more of a graphene layer, graphene oxide, graphene nano platelets, functionalized graphene, a graphene hybrid composite, graphene/superconductor composite, tubular shape nano carbon, semiconductor powder, thin film, nano wire, and/or nano rod, etc. Graphene layer 18300 can have a thickness that is between approximately 0.1 nm and approximately 50 micrometers. Graphene layer 18300 can comprise at least one of a composite of hybrid graphene, a composite of graphene nano platelets, and a polymer. When exposed to light energy, system 18000 can be adapted to undergo at least one of:

- a light induced physical change in which an electron-hole pair is generated and separated into a substantially free electron and a substantially free hole; and
- a light-induced chemical change in which an electron-proton pair is generated and separated into a substantially free proton and substantially free electron.

Light amplification element 18200 can be adapted to adsorb photon energy; generate the electron-hole pair or the electron-proton pair; and/or generate a plurality of free electrons, free holes, or free protons from an absorbed single photon; and/or via at least one of reducing agent or oxidizing agent, repeatedly perform a process described in Model 1 or Model 2, The effective photo induced charge injection layer can comprise specific semiconductors and/or specific photoconductors such as GaAs, single crystal Si, polycrystalline Si, amorphous Si, Si nano wire, nano crystalline Si, CdTe, CdSe, CdS, CIGS, Se, SiGe, $TiO_2$, nano $TiO_2$, ZnO, and/or a nano rod of ZnO, nano carbon materials such as carbon nano wire, carbon nano rod, and/or carbon nano tube, etc. System 1000 can be adapted to function with or without sensitizing dyes.

The effective photo induced charge injection layer can comprise specific organic pigments and dyes adapted for use as photoconductors. Examples of such photoconductors include, but are not limited to, ruthenium dye N719, an anionic dye, an acid dye, and/or a merocyanine dye, perylene pigments, perylenone pigments, phthalocyanine pigments, pyrollo-pyrole pigments, and/or

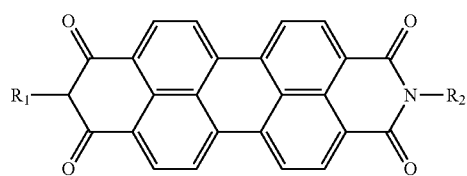

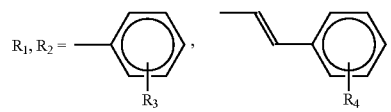

in which R1, R2, R3, are selected from hydrogen, alkyl, aryl, alkenyl, carrying with and without substitute groups OH, —COOH, —CHO, —$NO_2$, —CN, —SH, —$NR_4R_5$, —$SO_3H$, —$SO_3R_6$, or —$SO_2Cl$, etc.; and where R4, R5, and R6 are compounds comprising hydrogen, alkyl, aryl, alkenyl, carrying with and without substitute groups OH, —COOH, —CHO, —NO2, —CN, —SH, —$NR_4R_5$, —SO3H, —$SO3R_6$, or —SO2Cl, etc.

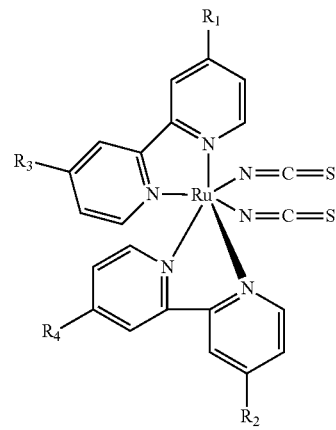

in which $R_1$, $R_2$, $R_3$, $R_4$, are selected from alkyl, aryl with and/or without substitute groups OH, —COOH, —CHO, —$NO_2$, —CN, —SH, —$NR_4R_5$, —$SO_3H$, —$SO_3R_6$, —$SO_2Cl$, etc.; where $R_4$, $R_5$, and $R_6$ are selected from alkyl, aryl with and/or without substitute groups OH, —COOH, —CHO, —$NO_2$, —CN, —SH, —$NR_4R_5$, —$SO_3H$, —$SO_3R_6$, —$SO_2Cl$, etc.; Examples of such dyes are:

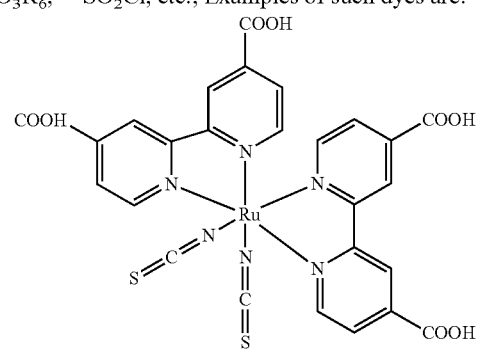

$N_3$ DYE

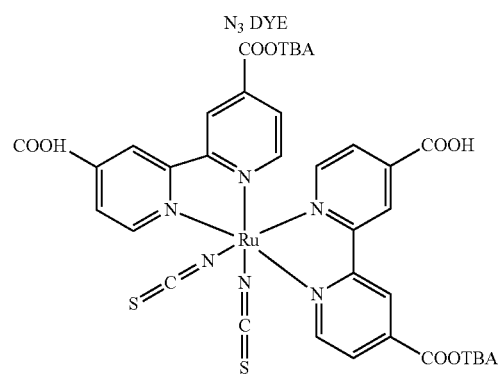

$N_{719}$ DYE, TBA = tetrabutylammonium cation

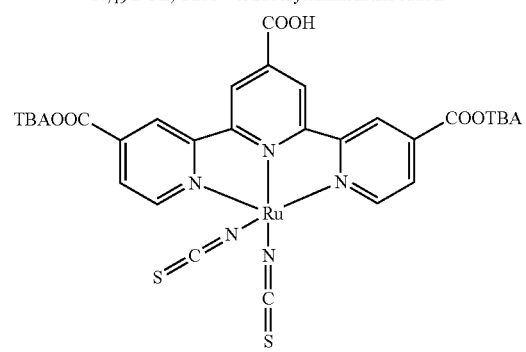

BLACK DYE, TBA = tetrabutylammoniumcation

The light amplification element can comprise a hole transport molecule as reducing agent such as, but not limited to:

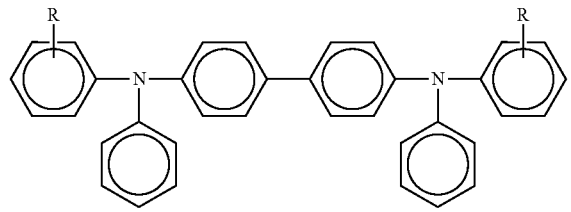

in which R comprises hydrogen, alkyl, aryl, alkenyl, carrying with and without substitute groups OH, —COOH, —CHO, —NO$_2$, —CN, —SH, —NR$_4$R$_5$, —SO$_3$H, —SO$_3$R$_6$, and/or —SO$_2$Cl, etc.

The light amplification element can comprise an electron transport molecule as oxidation agent such as, but not limited to:

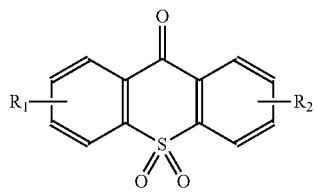

in which R$_1$, R$_2$ comprises hydrogen, alkyl, aryl, alkenyl, carrying with and without substitute groups OH, —COOH, —CHO, —NO$_2$, —CN, —SH, —NR$_4$R$_5$, —SO$_3$H, —SO$_3$R$_6$, and/or —SO$_2$Cl, etc.; in which R$_4$, R$_5$, and R$_6$ comprise hydrogen, alkyl, aryl, alkenyl, carrying with and without substitute groups OH, —COOH, —CHO, —NO$_2$, —CN, —SH, —NR$_4$R$_5$, —SO$_3$H, —SO$_3$R$_6$, and/or —SO$_2$Cl, etc.

The light amplification element can contain both hole transport molecule and electron transport molecule as above described in a suitable portion. The effective photo induced charge injection layer can comprise specific organic polymers such as conductive polymers, photovoltaic polymers. Examples of these polymers include, but are not limited to:

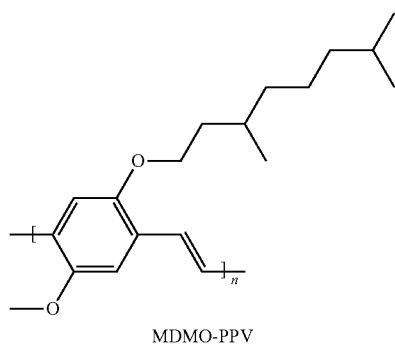

MDMO-PPV

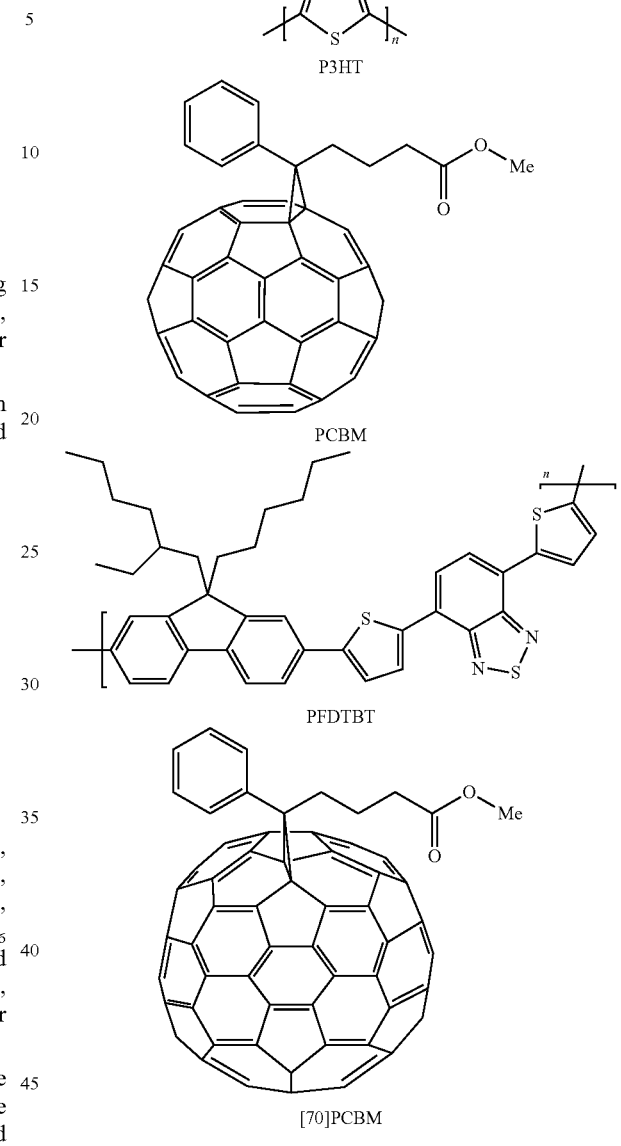

These organic pigments, dyes, conductive polymers, and/or PV polymers, etc. can be directly deposited onto the surface of a graphene layer by vacuum sublimation, by spin coating of solution in solvent, and/or by dispersion solution in solvent, etc.

Figure 19:
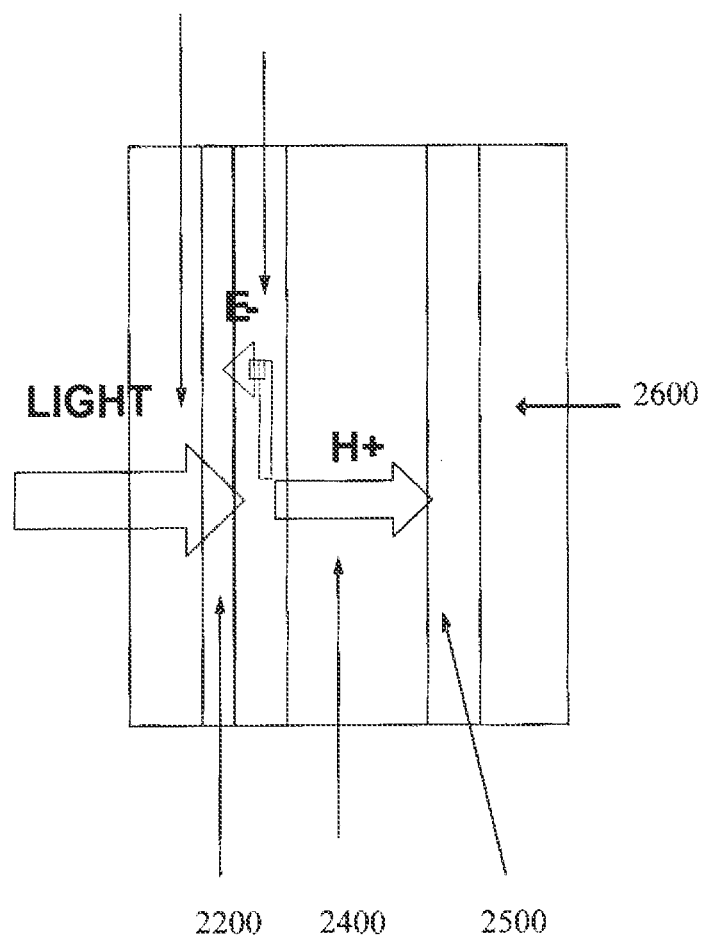
FIG. 19 is a block diagram of an exemplary embodiment of a system 19000.

FIG. 19 is a block diagram of an exemplary embodiment of a system 19000, which can comprise a transparent electrode 19100, a graphene layer 19200, a light-induced protonation layer 19300, a proton transport membrane 19400, an electrocatalyst 19500, and a conductive substrate 19600. In certain exemplary embodiments, light-induced protonation layer 19300 can comprise, but is not limited to, rhodopsin, chlorophil and the like. In certain exemplary embodiments, proton transport membrane 19400 can comprise sulfonated materials such as, but not limited to, polymers such as Nafion (Nafion is a sulfonated tetrafluoroethylene based fluoropolymer-copolymer and is a registered trademark of E.I. DuPont De Nemours and Company of Delaware), carbon and nano carbon such as "liquid" nano coal (e.g., US Patent Publication 20060112858), and/or liquid glass, etc.

In certain exemplary embodiments, electrocatalyst 19500 can comprise, but is not limited to, platinum and/or platinum/ruthenium, alloys of platinum with Ni, Cu, S, Se, or any metals which can minimize or eliminate the adsorption of $O_2$ onto it. FIG. 19 exhibits the structure of a light induced chemical change (light-induced protonation) which can be used for solar cells in the format of photo-fuel cells. Light hits light-induced protonation layer 19300 on the anode comprising graphene deposited on transparent electrode 19100 and generates an electronproton H+ pair. The electron migrates to graphene layer 19200 then to transparent electrode 19100. Proton H+ migrates through proton transport membrane 19400 to a cathode comprised of electrocatalyst 19500 deposited onto conductive substrate 19600, which can be a porous conductive substrate. The electrical signal due to the polarization between anode and cathode can be relatively large. Without graphene layer 19200, no response was observed.

Light-induced protonation layer 19300 can comprise one or more of: rhodopsin dye, and/or bacteriorhodopsin, with and without additives selected from the group of chemicals having electron accepting or electron donating functionality, etc.

Photo catalyst active molecules can be used to produce a proton from light. Proton transport membrane 19400 can comprise sulfonated polymers such as sulfonated Teflon (Teflon is a registered trademark of E.I. DuPont De Nemours and Company of Delaware), sulfonated polymers, which can comprise, but are not limited to, poly carbonate, sulfonated polyimidazol and polybenzimidazole, poly sulfone, sulfonated carbon black, "liquid" nano coal, and/or liquid glass (silica gel), etc.

Figure 20:
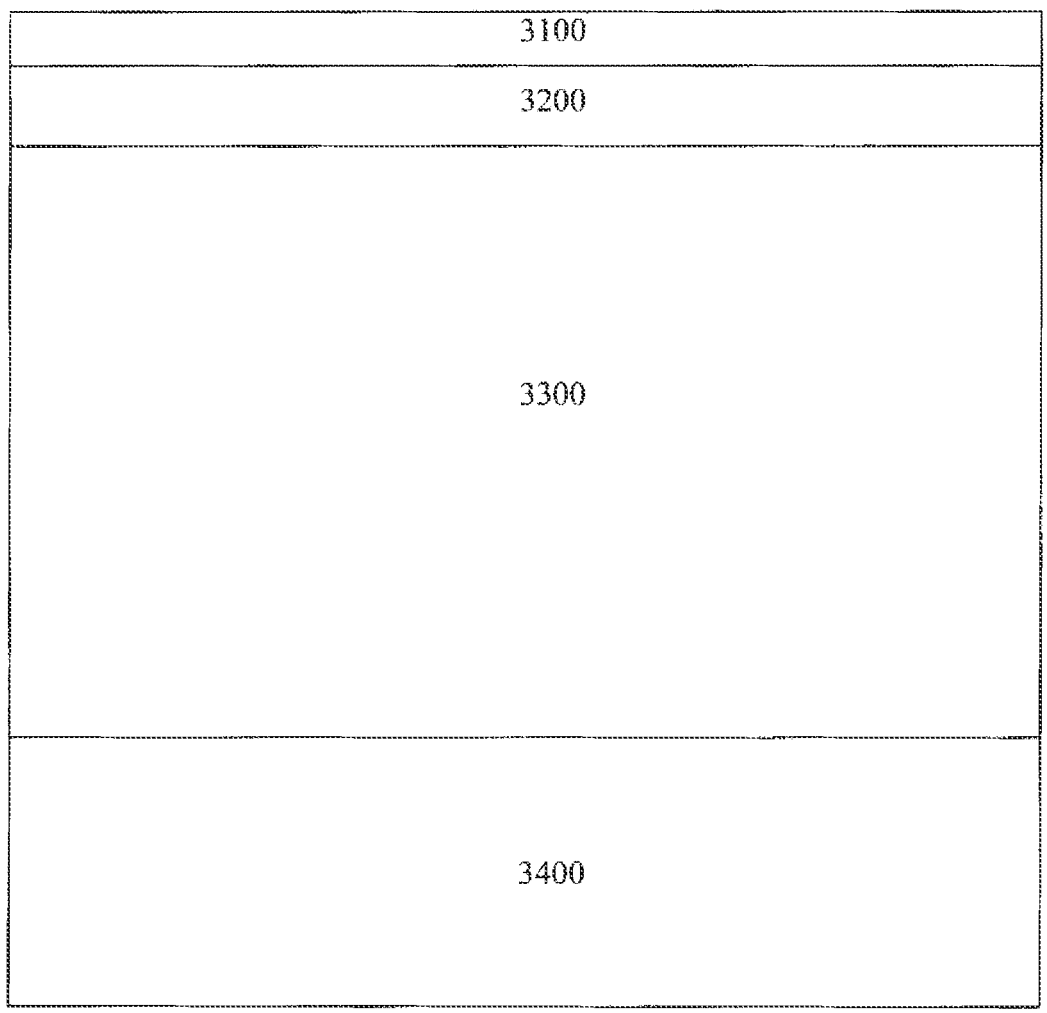
FIG. 20 is a block diagram of an exemplary embodiment of a system 20000.

FIG. 20 is a block diagram of an exemplary embodiment of a system 20000, which can comprise an electrode 20100, a semiconductor 20200, a graphene layer 20300, and a transparent conductor 20400. System 20000 can be a structure that utilizes graphene in a solar cell application. A thin film of semiconductor can be deposited directly onto graphene layer 20300 and the whole composite can sandwiched between electrode 20100 and transparent conductor 20400. Semiconductor 20200 can comprise one or more of CdS, ZnO, $TiO_2$, ZnO nano rod, nano $TiO_2$, CdTe, Se, CIGS, Se CdSe, Si nano wire, carbon nano rod, carbon nano wire, and/or amorphous Si, etc.

Figure 21:
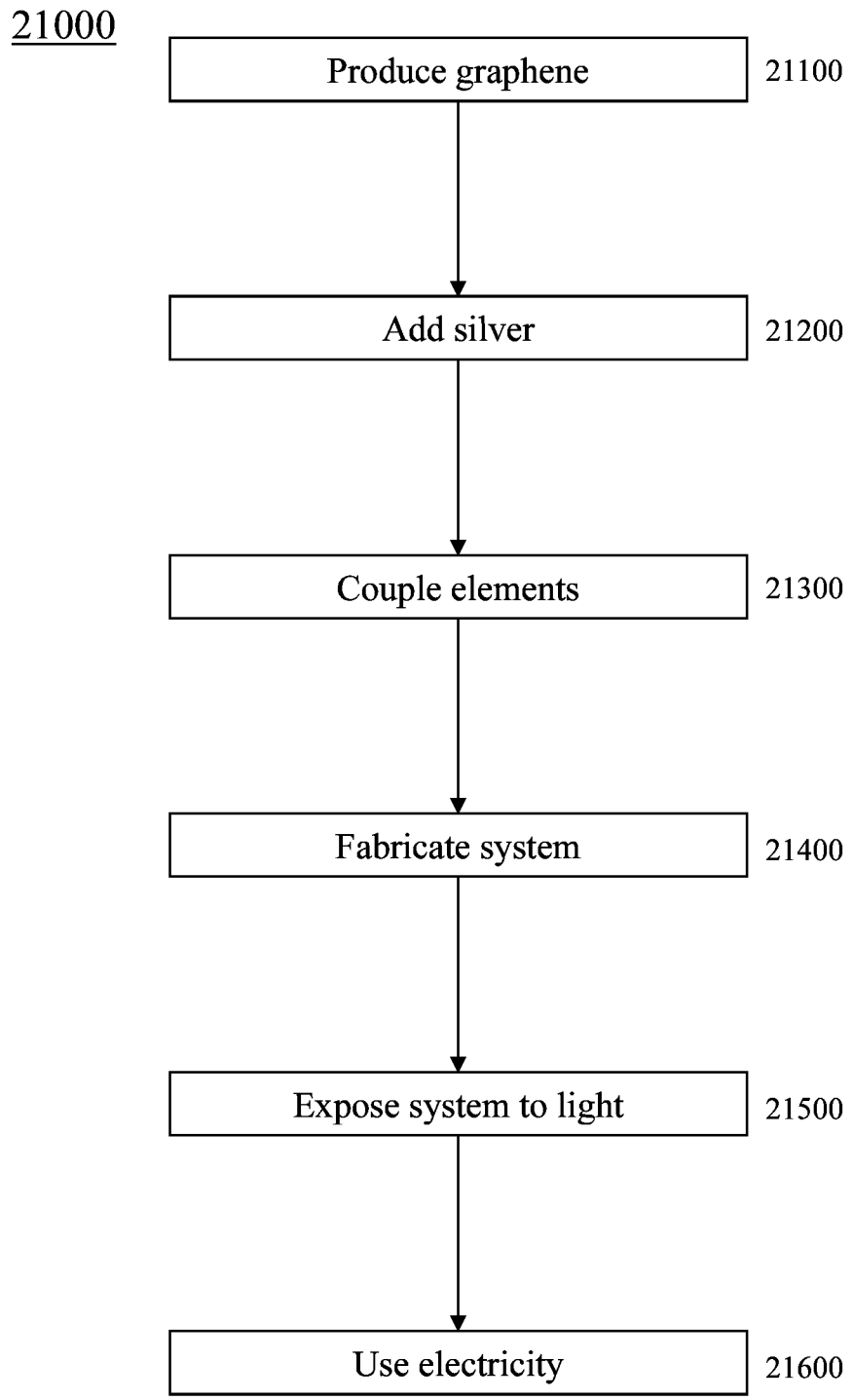
FIG. 21 is a flowchart of an exemplary embodiment of a method 21000.
Figure 22:
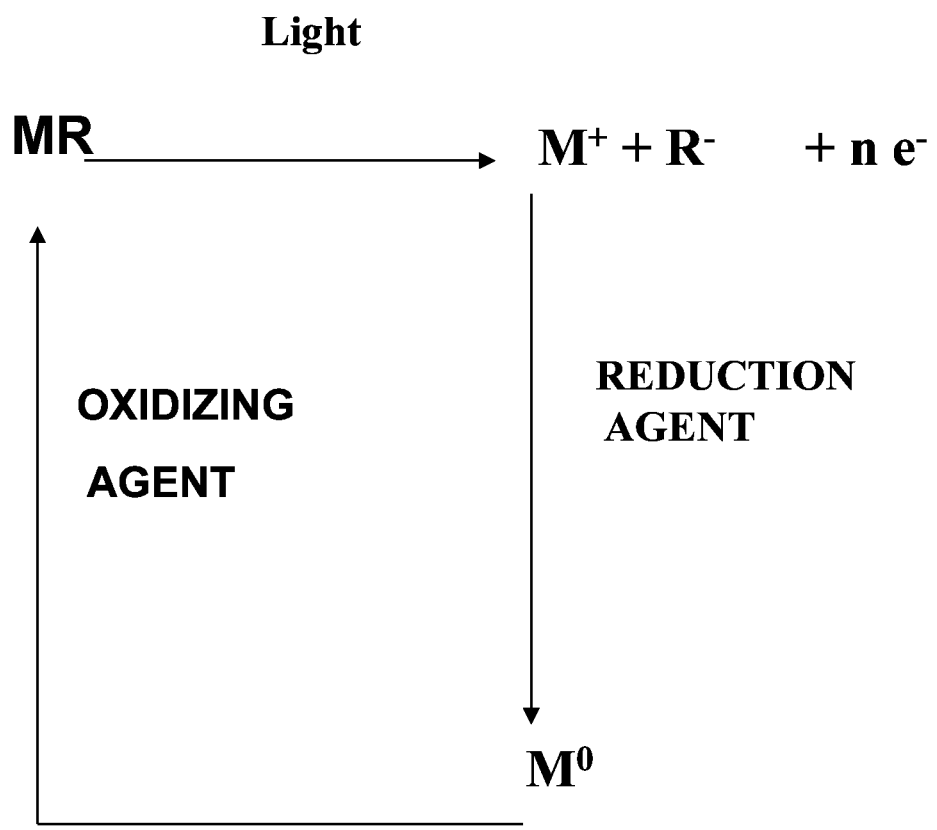
FIG. 22 is Model 1.
Figure 23:
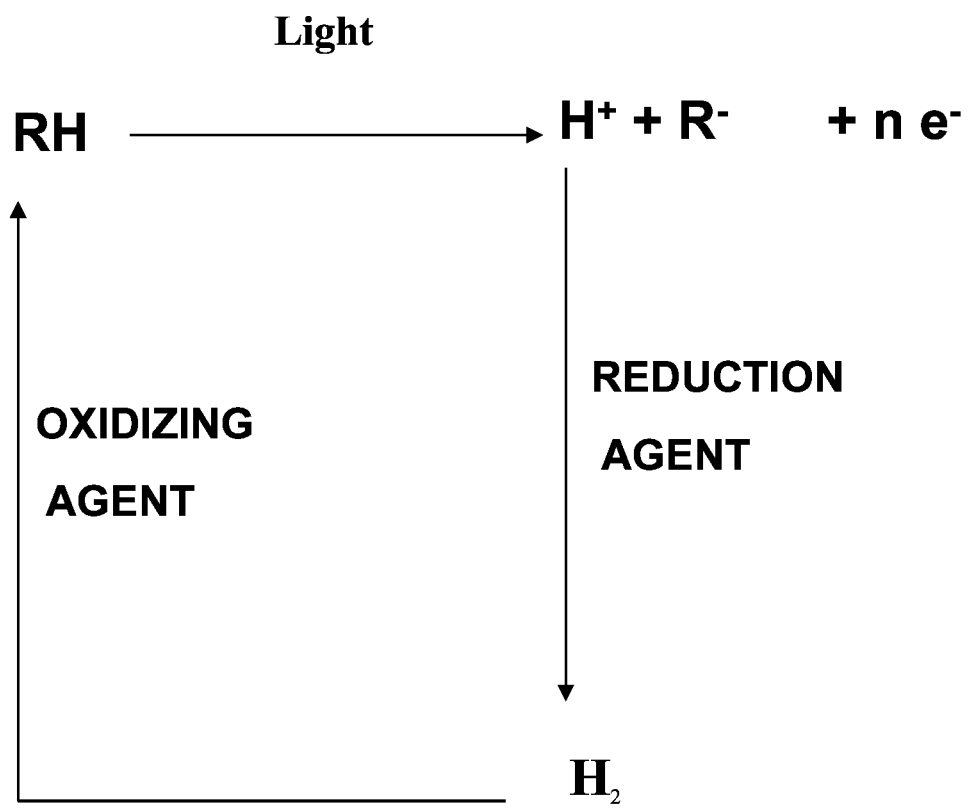
FIG. 23 is Model 2.

FIG. 21 is a flowchart of an exemplary embodiment of a method 21000. At activity 21100, graphene can be produced. For example, graphene can be of a form produced via a method disclosed in related and pending U.S. patent application Ser. No. 13/290,108.

At activity 21200, silver can be added, such as to a light amplification element adapted for use in a system. The light amplification element can comprise at least one of a light induced physical change element and a light-induced chemical change element. Each of the light amplification element and the charge transport element can comprise one or more of a graphene layer, graphene oxide, graphene nano platelets, functionalized graphene, a graphene hybrid composite, graphene/superconductor composite, tubular shaped nano carbon, semiconductor powder, thin film, nano wire, and/or nano rod, etc. The graphene layer can have a thickness that is between approximately 0.1 nanometer and approximately 50 micrometers.

In certain exemplary embodiments, at least one of nano silver particles, nano silver derivative particles, particles comprising silver, a photographic developer, photographic dyestuff, a photographic developer, oxidizing agent, and/or a reducing agent can be added to the light amplification element. In certain exemplary embodiments, the nano silver derivative particles can comprise at least one of AgX and $Ag_2Y$, where X is selected from halogen Cl, Br, I, F, $-NO_3$ and $-SO_4$ and Y is selected from chalcogenide elements. In certain exemplary embodiments, particles comprising silver can be added to the light amplification element. The light amplification element can comprise semiconductor compounds in the form of at least one of a thin film, a dispersion film, and/or a composite. The light amplification layer can comprise silver derivatives, thin film, and/or a composite of silver derivatives with polymers. The polymeric binder can comprise at least one of gelatin, poly amino acids, polyurethane, polyamides, polyimide, water soluble polymers, water insoluble polymers, emulsion polymers, cross linking polymers, nata de coco, hemicelluloses binder, conductive polymers, and/or photovoltaic polymers, etc.

In certain exemplary embodiments, the light amplification element can be an organic photoconductor. In certain exemplary embodiments, the light amplification element can comprise at least one of organic pigments, organic dyes, conductive polymers, and/or photovoltaic polymers, etc. The at least one of organic pigments and organic dyes can comprise silver and/or silver derivatives. In certain exemplary embodiments, the light amplification element can comprise a polymeric binder. The polymeric binder can comprise at least one of gelatin, poly amino acids, poly urethane, polyamides, polyimide, water soluble polymers, water insoluble polymers, emulsion polymers, cross linking polymers, nata de coco, and/or hemicelluloses binder, etc.

At activity 21300, elements can be coupled. In certain exemplary embodiments, the light amplification element can be operatively coupled to electron donor or electron acceptor hole transport molecules and/or electron transport molecules. A charge transport element operatively coupled to the system can comprise at least one of a composite of hybrid graphene, a composite of graphene nano platelets, and/or a polymer, etc.

At activity 21400, the system can be fabricated, such as system 18000 of FIG. 18, system 19000 of FIG. 19, and/or system 20000 of FIG. 20. The system can be adapted for use in at least one of a solar cell, photo detector, photoconductor, photo fuel cell, a light emitting diode, and electrical power generation. The system can be intercalated between a first electrode and a second electrode that is a substantially optically transparent electrical conductor. The optically transparent electrical conductor can comprise graphene. In certain exemplary embodiments, the system can be located on an electrical conductive substrate.

When exposed to light energy, the system can be adapted to undergo at least one of: a light induced physical change in which an electron-hole pair is generated and separated into a substantially free electron and a substantially free hole; and a light-induced chemical change in which an electron-proton pair is generated and separated into a substantially free proton and substantially free electron. In certain exemplary embodiments, the light amplification element can be adapted to: adsorb light energy; generate the electron-hole pair or the electron-proton pair; generate a plurality of free electrons, free holes, or free protons from an absorbed single photon; and/or via at least one of reducing agent or oxidizing agent, repeatedly perform a process described in Model 1 or Model 2.

At activity 21500, the system can be exposed to light. At activity 21600, electricity produced by the system can be used. Electrical signals passing through the system can be electrically coupled to a capacitor and/or a supercapacitor.

Several exemplary embodiments have been explored. For example:

Example 1 preparation of Cu substrate:
approximately 20 grams of Cupper iodide ("$CuI_2$") was dissolved in approximately 80 grams ethanol plus a few drops of ionic surfactant, surfynol 465, and approximately grams of polyvinylpyrrolidone ("PVP") (20% solid). The solution was spun onto a very well cleaned pyrex glass substrate with spin speed of approximately 5000 rounds per minute ("rpm") for approximately 60 seconds using a spinner. A spun film resulted, which was dried at room temperature for approximately 30 minutes, then baked in a convection oven at approximately 80 degrees Celsius for approximately 30 minutes.

The pyrex glass substrate carrying Cu salt and PVP film was annealed at approximately 800 degrees Celsius for approximately 30 minutes in an oven comprising the inert gas, argon. After annealing, a thin film of Cu was confirmed to show a thickness of approximately 10 microns and electrical resistivity of approximately 0.2 ohm-cm Preparation of graphene layer:
the pyrex glass substrate carrying Cu thin film was inserted into the reaction chamber of a thermal chemical vapor deposition (manufactured by ULVAC Technologies, Inc. Japan) where a vacuum of approximately $10^{-3}$ torr was set then $N_2$ was slowly fed with a flow rate of 15 standard cubic centimeters per minute ("sccm"). During the $N_2$ flush, the reaction chamber was slowly heated to approximately 1200 degrees Celsius. Right after that, a $CH_4/H_2$ gas mix was introduced into the reaction chamber with a flow rate of approximately 25 sccm for approximately 25 minutes. The system was then shut down and cooled off for approximately 60 minutes before the sample was taken out of reaction chamber.

The graphene layer was characterized and confirmed with field emission scanning electron microscopy, transmission electron microscopy, X-ray diffraction and Raman spectroscopy. The thickness of the graphene layer was detected to be approximately 1.5 microns with a bulk electrical resistivity of approximately 0.3 ohm-cm

Example 2 preparation of a light induced physical change layer using organic pigment:
approximately 5 grams of phenethyl perylene pigment Paliogene Black (obtained from BASF Corporation of Florham Park, N.J.) was placed in a high heat resistant ceramic crucible. The whole system was placed inside a vacuum evaporator. The evaporator chamber was evacuated until the vacuum reached approximately $10^{-7}$ torr. The crucible then was heated up to approximately 50 degrees Celsius and started deliver pigment vapor to the surface of graphene layer prepared in example 1 for approximately 1 minute. The heater was shut off. The whole chamber was cooled down to the room temperature and the graphene layer covered with the perylene pigment sample was taken out of vacuum chamber. The thickness of the pigment was measured with a stylus profiler and detected to be approximately 0.01 micron with bulk resistivity of approximately 1.5 ohm-cm.

The whole system was sandwiched with an indium tin oxide ("ITO") film and exposed to the light in a solar simulator. The efficiency was detected to be approximately 0.03%.

Example 3 example 1 was repeated except that the thin film of hole transport molecule was deposited on the top of the pigment layer by the same way to make the thin film of the phenethyl pigment. The efficiency was detected to be approximately 22% revealing the amplification effect due to reducing agent

Example 4 example 1 was repeated except that nano silver solution comprising a mixture of gelatin and nano silver in a ratio of gelatin/silver of approximately 6/4 by weight was spin coated on the top of graphene layer and baked at approximately 50 degrees Celsius for approximately 3 hours to achieve a thickness of approximately 0.5 microns.

The whole system was exposed to $Br_2$ gas in a vacuum box for approximately 2 hours to achieve gelatin/nano AgBr having a grey color from a black color of the original samples. The system was kept in dark for approximately 24 hours then exposed to sun light through the solar simulator and efficiency was detected to be approximately 0.4%.

Example 5 example 4 was repeated except that the nano silver layer was added with photographic developer in a portion of approximately 20% by weight. The efficiency was detected to be approximately 20% revealing the effect of the developer additive.

Example 6 example 5 was repeated except that the nano silver layer was added with rhodamine B dye (obtained from Sigma-Aldrich Chemical of St. Louis, Mo.) in a portion of approximately 0.1%. The efficiency detected from the solar simulator was approximately 40% revealing the amplification effect due to nano silver bromide/dye.

Example 7 example 6 was repeated except that an N719 dye was used instead of Rhodamine B dye. The efficiency detected from the solar simulator was approximately 58% revealing the amplification effect due to nano silver bromide/N719 dye complex on graphene.

Example 8 example 2 was repeated except that the phenethyl pigment was replaced with N719 dye. The efficiency detected from the solar simulator was approximately 25%.

Example 9 approximately 4 grams of a graphene hybrid (following U.S. patent application Ser. No. 13/290,108), approximately 10 grams TBD hole transport molecule, approximately 0.1 grams dye N719 and approximately 50 grams zirconium beads, approximately 10 grams g dichloromethane, approximately 10 grams 1,1,2-trichloroethane, approximately 0.01 grams DC510 surfactant, approximately 6 grams Makrolon® poly carbonate (Makrolon is a registered trademark of Bayer Aktiengesellschaft of Germany) were put together in a glass jar having a size of approximately 60 ml. The whole jar was strongly shaken using a paint shaker for approximately 2 hours. A mixed solution was isolated from the milling media and painted on a Ni substrate and baked in an oven at approximately 80 degrees Celsius for approximately 2 hours. The thickness was detected to be approximately 2 microns. The system was connected with a transparent electrode made out of ITO and the light induced electrical signal was measured with solar simulator. The detected efficiency was approximately 5.5%.

Example 10 example 1 was repeated except that the light amplification layer was a mixture of nano $TiO_2$ absorbed with N719 dye (approximately 0.1%). The detected efficiency was approximately 15%.

Example 11

Photo-Fuel Cell on a porous conductive substrate Toray carbon paper, an electro catalyst composed of approximately 60% nano Pt and approximately 40% Vulcan XR72C (obtained from Cabot Corp. of Boston, Mass.) was painted from an N-Methyl-2-pyrrolidonemethyl ethyl ketone mix solvent and baked at approximately 80 degrees Celsius for approximately 20 minutes. The catalyst loading was measured to be approximately 2.3 milligrams per square centimeter. A proton transport membrane Nafion® 211 (obtained from E.I. DuPont De Nemours and Company of Delaware) was deposited directly on the top of Pt nano catalyst using heat press mode (approximately 100 pounds per square inch, approximately 80 degrees Celsius) for approximately 7 minutes. Next a solution of Rhodopsin dye (approximately 1%) in ethyl alcohol was spun (approximately 5000 rpm for approximately 30 seconds) on the top of Nafion® and the system was baked at approximately 80 degrees Celsius for approximately 3 minutes. The system was connected with transparent electrode made out of graphene substrate prepared in Example 1 and tested with the solar simulator. The efficiency was detected to be approximately 5.5%

Certain exemplary embodiments can provide a system comprising a hybrid composite. The hybrid composite can comprise tubular carbon and graphene produced via pyrolysis of a milled solid carbon source under an unoxidizing environment. When analyzed via X-ray diffraction, the hybrid composite can generate peaks at two theta values of approximately 26.5 degrees, approximately 42.5 degrees, and/or approximately 54.5 degrees.

A hybrid of graphene flakes and tubular shape nano carbon can be produced from the pyrolysis of a salt milled solid carbon source under unoxidizing environment using a specific Fe relative catalyst. The hybrid is characterized by X-Ray diffraction patterns (XRD) with diffraction peaks at two theta values of approximately 26.5 degrees, approximately 42.5 degrees, and approximately 54.5 degrees. The hybrid composite exhibits relatively high electrical conductivity and enhanced compatibility with various kinds of materials over tubular shape nano carbon products as well as relatively pure graphene nano platelets. The hybrid composite can be effective for electron producing catalysts, electro conductive applications such as conductive painting and lacquers, electromagnetic shielding, conductive inks, transparent conductors, electro conductive mechanical processing such as bipolar plates for hydrogen fuel cells, biosensors, glucose meters, and/or alcohol detectors, etc.

Carbon can have four unique crystalline structures, including diamond, graphite, fullerene, and carbon nano-tubes. Graphene is an allotrope of carbon, whose structure comprises substantially one-atom-thick planar sheets of sp-bonded carbon atoms that are packed in a honeycomb crystal lattice. Graphene can be visualized as an atomic-scale sheet made of carbon atoms and their bonds. The crystalline or "flake" form of graphite consists of many graphene sheets stacked together.

The phrase "carbon nano-tube" ("CNT") refers to a tubular structure, which can be grown with a single wall or multi-walls. A CNT can be conceptually visualized as rolling up a graphene sheet or several graphene sheets to form a concentric hollow structure. A graphene sheet comprises carbon atoms occupying a two-dimensional hexagonal lattice. By dispersing oxidized and chemically processed graphite in water, and using paper-making techniques, substantially monolayer flakes can form a single sheet and bond relatively powerfully. Such sheets, which can be called graphene oxide paper, can have a measured tensile modulus of approximately 32 Gigapascals ("GPa"). Chemical properties of graphite oxide can be related to functional groups attached to graphene sheets. The functional groups can change the pathway of polymerization and similar chemical processes. Graphene oxide flakes in polymers can have enhanced photo-conducting properties compared to polymers lacking such flakes.

Graphene nano platelets can comprise a stack of multi-layer graphene sheets. Graphite has a layered, substantially planar structure. In each layer, the carbon atoms are arranged in a hexagonal lattice with separation of approximately 0.142 nanometers ("nm"), and the distance between planes is approximately 0.335 nm. Two forms of graphite, alpha (hexagonal) and beta (rhombohedral), have very similar physical properties (except that the graphene layers stack slightly differently). The hexagonal graphite can be either flat or buckled. The alpha form can be converted to the beta form through mechanical treatment and the beta form can revert to the alpha form when it is heated above approximately 1300° Celsius. The layering contributes to its relatively low density.

CNTs can have a diameter that ranges from on the order of a few nanometers to a few hundred nanometers. CNTs can function as either a conductor or a semiconductor, depending on the rolled shape and the diameter of the tubes. A longitudinal, hollow structure imparts unique mechanical, electrical, and chemical properties to CNTs. CNTs can be used in field emission devices, hydrogen fuel storage, rechargeable battery electrodes, and/or composite reinforcements, etc. However, CNTs can be relatively expensive due to the low yield and low production and purification rates associated with certain CNT preparation processes. High material costs might hinder widespread application of CNTs. Certain exemplary embodiments provide processes for producing individual nano-scaled graphite planes (individual graphene sheets) and stacks of multiple nano-scaled graphene sheets, which can be collectively called nano-scaled graphene plates (NGPs) or nano graphene platelets. NGPs may be visualized by making a longitudinal scission on the single-wall or multi-wall of a nano-tube along its tube axis direction and then flattening up the resulting sheet or plate. Certain exemplary nano materials can be substitutes for carbon nano-tubes or other types of nano-rods for various scientific and engineering applications. Certain exemplary embodiments provide for an indirect synthesis approach for preparing NGPs and related materials. Certain exemplary processes comprise (1) providing a graphite powder containing fine graphite particles (particulates, short fiber segments, carbon whisker, graphitic nano-fibers, and/or combinations thereof) preferably with at least one dimension smaller than approximately 1 micrometer); (2) exfoliating the graphite crystallites in these particles in such a manner that at least two graphene planes are either partially or fully separated from each other, and (3) mechanical attrition (e.g., ball milling) of the exfoliated particles to become nano-scaled to obtain NGPs. The starting powder type and size, exfoliation conditions (e.g., intercalation chemical type and concentration, temperature cycles, and the mechanical attrition conditions (e.g., ball milling time and intensity) can be varied to generate, by design, various NGP materials with a wide range of graphene plate thickness, width and length values. Ball milling can be an effective process for mass-producing ultra-fine powder particles. The processing ease and the wide property ranges that can be achieved with NGP materials make them candidates for many important industrial applications. The electronic, thermal, and mechanical properties of NGP materials can be comparable to those of carbon nano-tubes.

In certain exemplary embodiments, graphene sheets can be made via chemical vapor deposition of methane to grow graphene on thin nickel films. Certain exemplary embodiments provide a process of making graphene nanoribbons in which graphene is twisted within nanotubes. In certain exemplary embodiments, these materials can be characterized by one or more of poor dispersion, not having enough electro conductivity, limited compatibility with other materials for development of composites for new applications, and/or high cost as materials manufacturing requires plasma CVD reactor of gas phase materials.

In certain exemplary embodiments, a type of nano carbon hybrid comprised of tubular shape nano carbon and graphene can be prepared by the pyrolysis of solid carbon source(s) using specific catalyst comprising iron relatives. According to the effect of the iron related catalyst, the amount of the catalyst or MS/CS ratio; wherein MS means metal source, CS means solid carbon source; can provide many products having different properties. In certain exemplary MS/CS ratios, the hybrid exhibits relatively high electro conductivity, relatively good dispersion, and/or relatively good compatibility with other materials. Certain exemplary embodiments can utilize an iron related catalyst to convert a milled solid carbon source into graphene or graphene hybrid with tubular nano carbon, which gives rise to relatively good conductivity at the certain range of MS/CS ratios. MS/CS values less than approximately 0.10 can give rise to the tubular shape nano carbon. MS/CS values greater than approximately 0.3 and give rise to the graphene related products.

In order to obtain the above described properties, the tubular shape nano carbon products (tube, wire, rod) and graphene related products can be prepared via two steps:
the first step is grinding the solid carbon sources to a relatively fine size via a milling process, such as via salt milling; salt milling is a grinding process adapted to turn solid carbon sources into finer particle to absorb catalyst molecules before going to the pyrolysis; and
the second step is the pyrolysis of the solid carbon sources in an unoxidizing environment.

Certain exemplary embodiments provide relatively good electro conductivity. The solid carbon sources can be selected from a large variety of solid carbon sources already exist in nature including tree woods, beans, cotton, agricultural products such as paddy husks and/or coconut shells, etc.

The above cited solid carbon sources can be used alone or can be used together with certain kind of chemicals having functionality of forming tube. These chemicals art so called as tube control agent (TCA). The TCA molecules usually contain carbonitrile —CN functional groups and examples of TCA comprise tree lignin, phthalonitrile, and/or other derivatives, etc.

For salt milling, any salts can be used including NaCl (table salt), NaBr, NaI, NaF, $Na_2CO_3$, organic salts, and/or inorganic salts, etc. The salt milling process can be done with any devices having grinding, blending, and/or mixing mechanisms. The milling process can be performed with different milling media instead of and/or in addition to salt, such as glass beads, plastic beads, ceramic beads, metallic balls, and/or metallic beads, etc. Salt removal from salt milled solid carbon sources can be done by washing the milled solid carbon with water. Tap water, deionized water, sea water, hot or cold water, and/or any solvents capable of dissolving the salts can be effectively used as agents for washing.

The following is an example (hereinafter referenced as "Example 1") of an exemplary embodiment:
Step 1: Rough grinding—a branch of red wood was ground with wood grinder to achieve wood chips having average particle size of a few millimeters to a few centimeters.
Step 2: Fine grinding—the wood chip were ground again with fine wood grinder to achieve particles having an average particle size in the range of approximately 500 microns.
Step 3: Salt milling—the finely ground particles of step 2 were mixed with table salt in a glass jar and milled by a rotary miller. The milled particles were poured into a beaker containing tap water and the mixture was stirred with magnetic stirrer for approximately one hour, and then filtered to collect the salt milled wood. The process was repeated until the salt was substantially removed. The salt milled product was dried in an oven.
Step 4: Mixing with catalyst—approximately 10 grams of $NiCl_{26}H_2O$ ("Ni salt") MS was substantially dissolved in a beaker containing approximately 100 grams of deionized water and the amount of salt milled solid CS of step 3 was calculated such that the MS/CS by weight was approximately 0.05. The salt milled product was slowly adding into the solution of Ni salt and stirred at a temperature of approximately 100 degrees Celsius to evaporate the water.
Step 5: Making nano carbon and graphene related—The nano carbon precursor prepared in step 4 was fed into a quartz tube filled with vacuum and baked at approximately 900 degrees Celsius for approximately one hour. Then the heat source was shut down and cooled off to room temperature. The black product was collected and washed with HCl at a concentration of approximately 6 Molar for approximately one hour at approximately 70 degrees Celsius to remove metal catalyst then dried in an oven at approximately 80 degrees Celsius for approximately three hours to achieve a nano carbon product.

FIG. 1 is a graph 1000 of resistivity values for pyrolysis products of exemplary embodiments. Bulk electrical resistivity values of pyrolysis products produced in accordance with Example 1, at different MS/CS ratio for iron (Fe) catalyst and non iron catalyst (Ni, comparison example), were measured. FIG. 1 illustrates the effect of (MS/CS) ratio on the bulk resistivity (ohm-cm) of the pyrolysis products prepared by two different kinds of catalyst; the iron, as prepared in accordance Example 1 and a nickel ("Ni") catalyst for comparison.

From the result described in FIG. 1, one can see that both catalysts exhibit the maximum electroconductivity in the vicinity of (MS/CS) ratio between approximately 0.10-0.20. The electrical resistivity of the pyrolysis products due to Fe catalyst is much lower than that of non-ferric type (for example Ni) in the value range between approximately 0.013-0.019 (ohm-cm). For a reference, the bulk electrical resistivity of a single walled nano tube, commercially available from Cheaptubes LLC, is approximately 0.079 ohm-cm, the bulk electrical resistivity of the graphene nano platelet, commercially available from Cheaptubes LLC, is approximately 0.055 ohm-cm.

Figure 2:
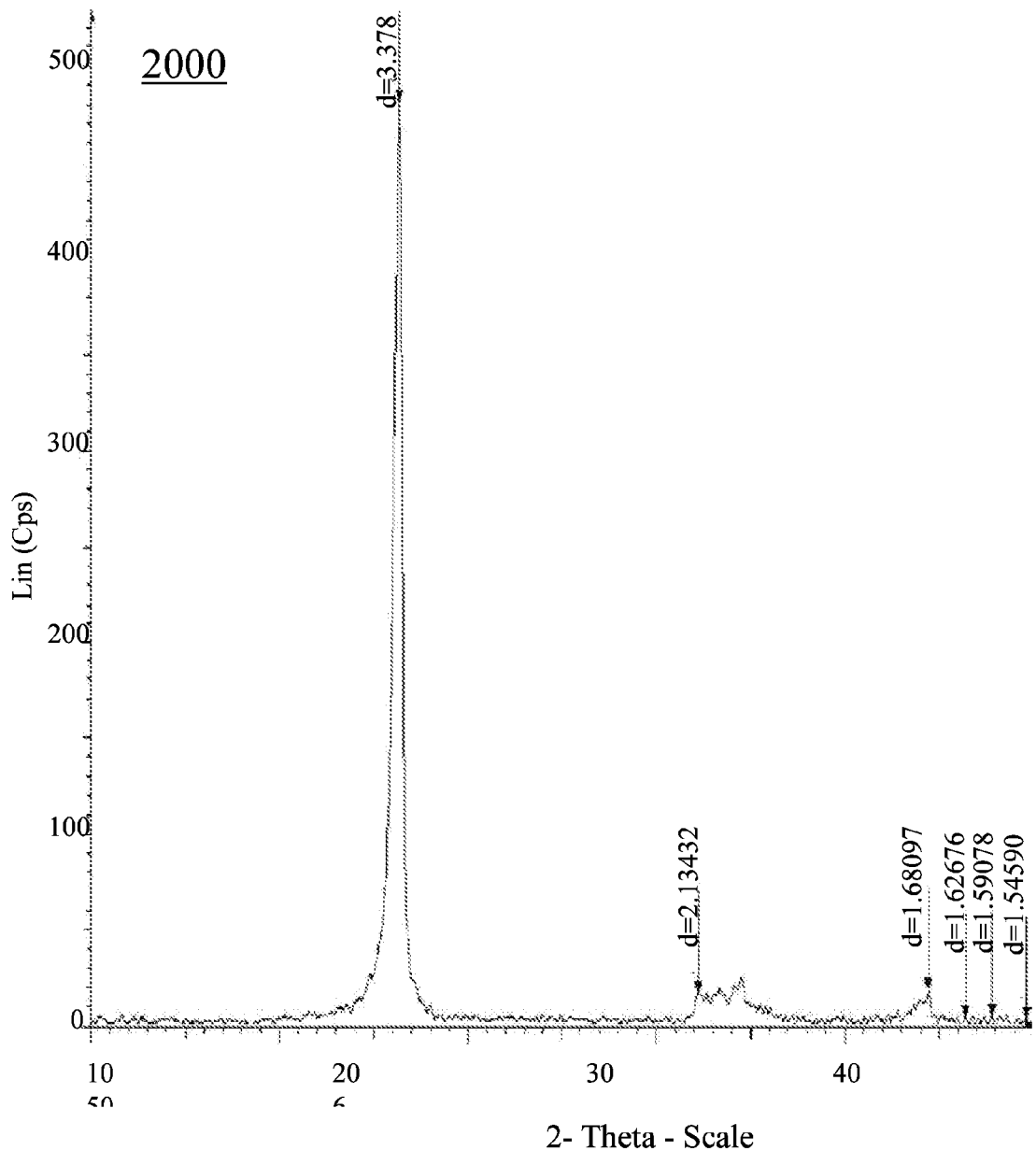
FIG. 2 is a graph 2000 of X-ray diffraction ("XRD") results for an exemplary pyrolysis product according to an exemplary embodiment.
Figure 3:
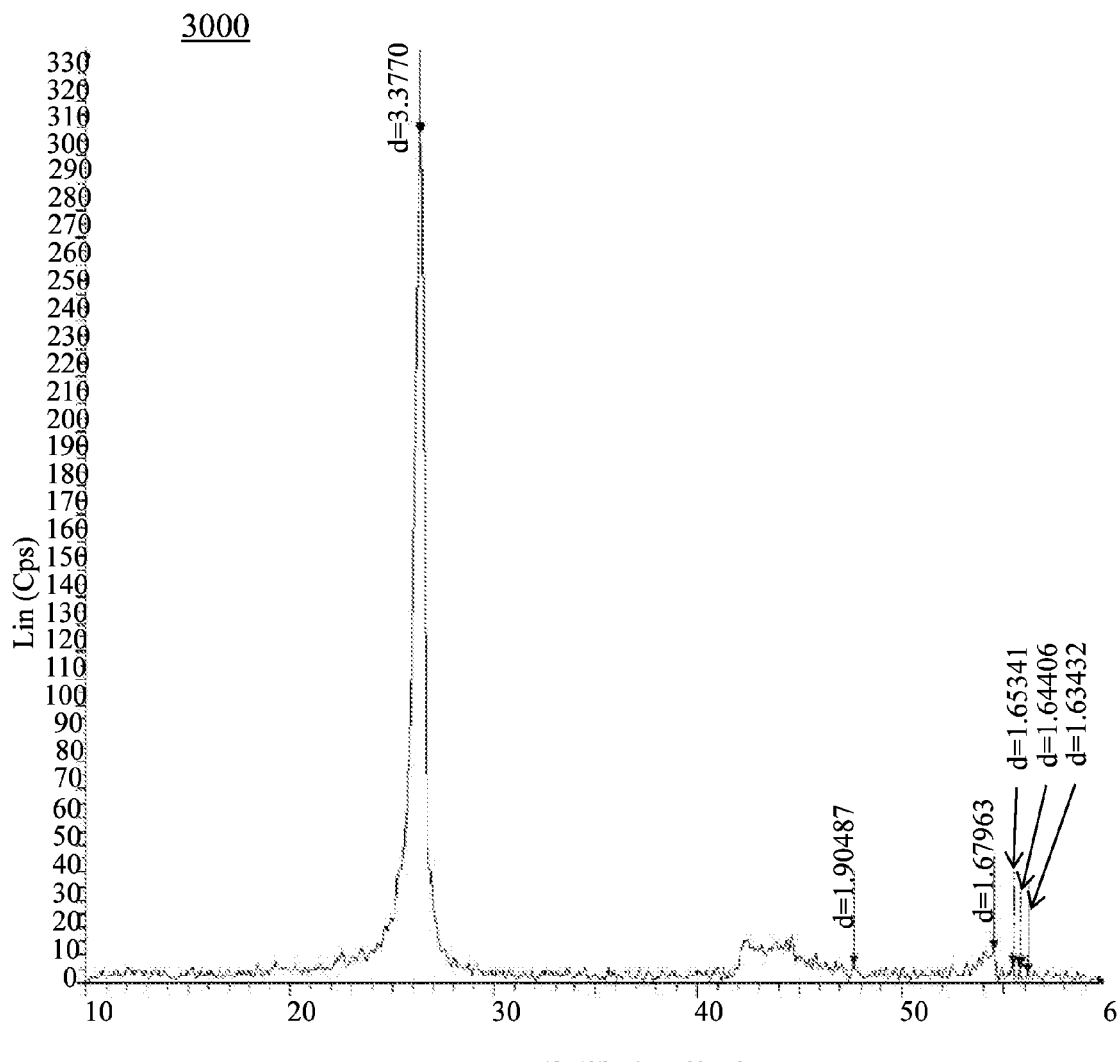
FIG. 3 is a graph 3000 of X-ray diffraction ("XRD") results for an exemplary pyrolysis product according to an exemplary embodiment.
Figure 4:
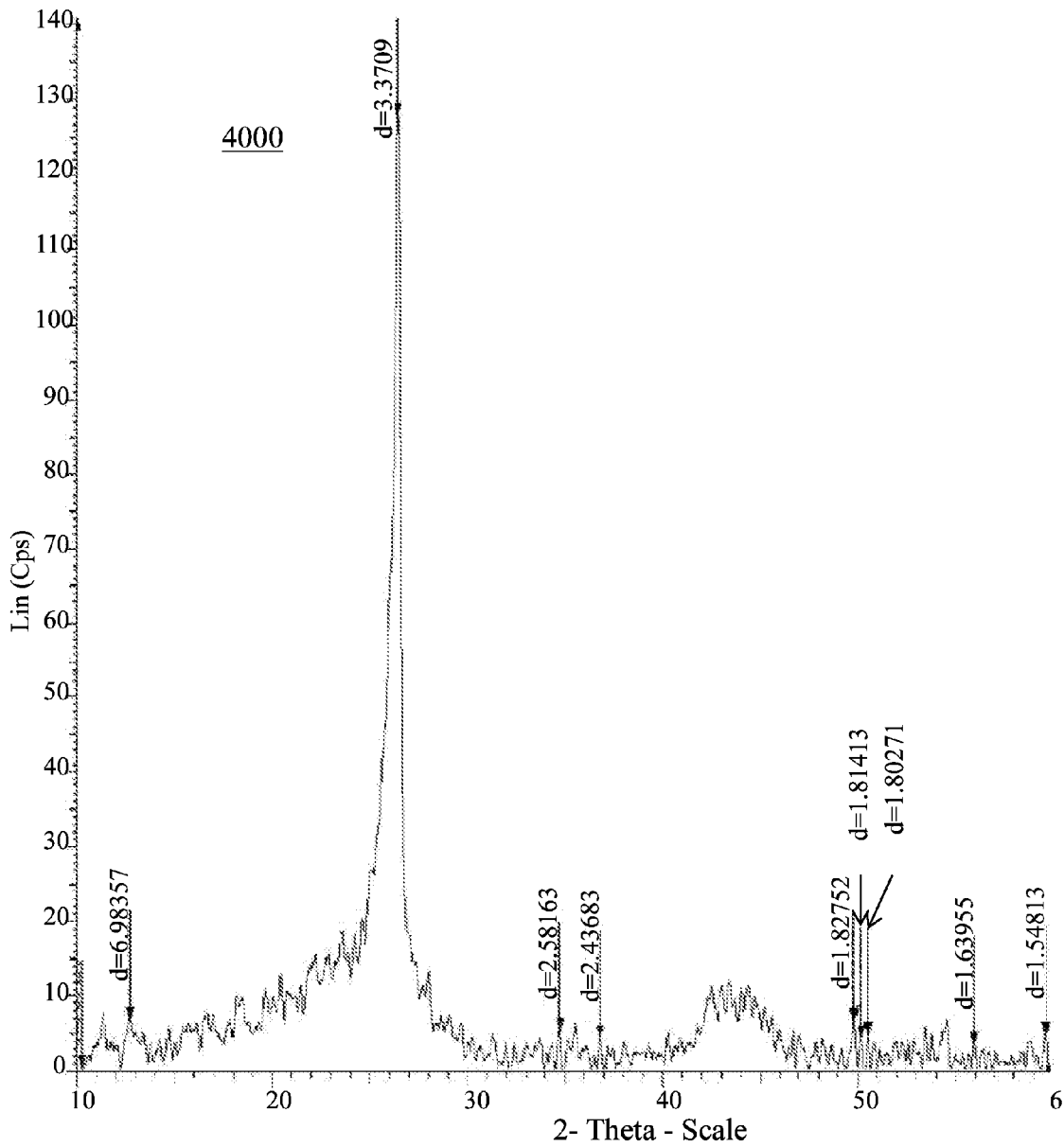
FIG. 4 is a graph 4000 of X-ray diffraction ("XRD") results for an exemplary pyrolysis product according to an exemplary embodiment.

FIG. 2 is a graph 2000 of X-ray diffraction ("XRD") results for an exemplary pyrolysis product according to an exemplary embodiment. The pyrolysis product that was analyzed in FIG. 2 was prepared from a Fe catalyst with an MS/CS ratio of approximately 0.24. FIG. 3 is a graph 3000 of X-ray diffraction ("XRD") results for an exemplary pyrolysis product according to an exemplary embodiment. The pyrolysis product that was analyzed in FIG. 3 was prepared from salt milled solid carbon sources using a Fe catalyst with an MS/CS ratio of approximately 0.18. FIG. 4 is a graph 4000 of X-ray diffraction ("XRD") results for an exemplary pyrolysis product according to an exemplary embodiment. The pyrolysis product that was analyzed in FIG. 4 was prepared from salt milled solid carbon sources using a Fe catalyst with an MS/CS ratio of approximately 0.48.

FIG. 5 is a graph 5000 of X-ray diffraction ("XRD") results for an exemplary pyrolysis product according to an exemplary embodiment. The pyrolysis product that was analyzed in FIG. 5 was prepared from salt milled solid carbon sources using a Fe catalyst with an MS/CS ratio of approximately 0.12. FIG. 6 is a graph 6000 of X-ray diffraction ("XRD") results for an exemplary pyrolysis product according to an exemplary embodiment. The pyrolysis product that was analyzed in FIG. 6 was prepared from salt milled solid carbon sources using a Fe catalyst with an MS/CS ratio of approximately 0.96.

FIG. 2, FIG. 3, FIG. 4, FIG. 5, and FIG. 6 exhibit X-ray diffraction ("XRD") results of various pyrolysis products prepared with Fe catalyst at different levels of catalyst use. Each of these samples exhibited XRD results with diffraction peaks appeared at two theta of approximately 26.5 degrees, approximately 43 degrees, and approximately 54 degrees.

Figure 7:
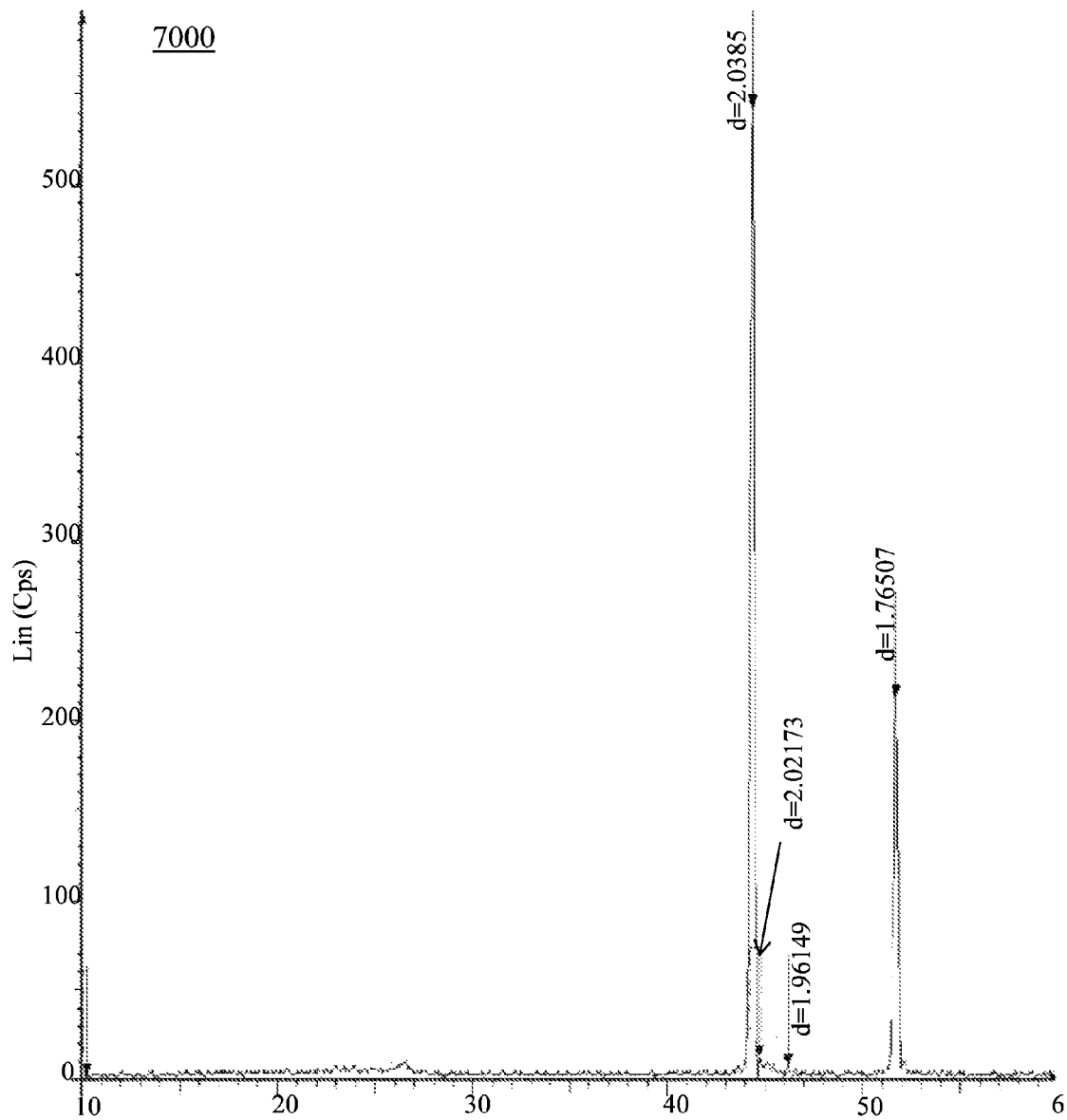
FIG. 7 is a graph 7000 of X-ray diffraction ("XRD") results for an exemplary pyrolysis product according to an exemplary embodiment.

FIG. 7 is a graph 7000 of X-ray diffraction ("XRD") results for an exemplary pyrolysis product according to an exemplary embodiment. The pyrolysis product that was analyzed in FIG. 7 was prepared from salt milled solid carbon sources using a Ni catalyst with an MS/CS ratio of approximately 2.56. Diffraction peaks appeared at two theta values of approximately 44.5 degrees and approximately 51.6 degrees. Certain exemplary pyrolysis products were imaged using Field Emission Scanning Electron Microscopy ("FE-SEM").

Figure 8:
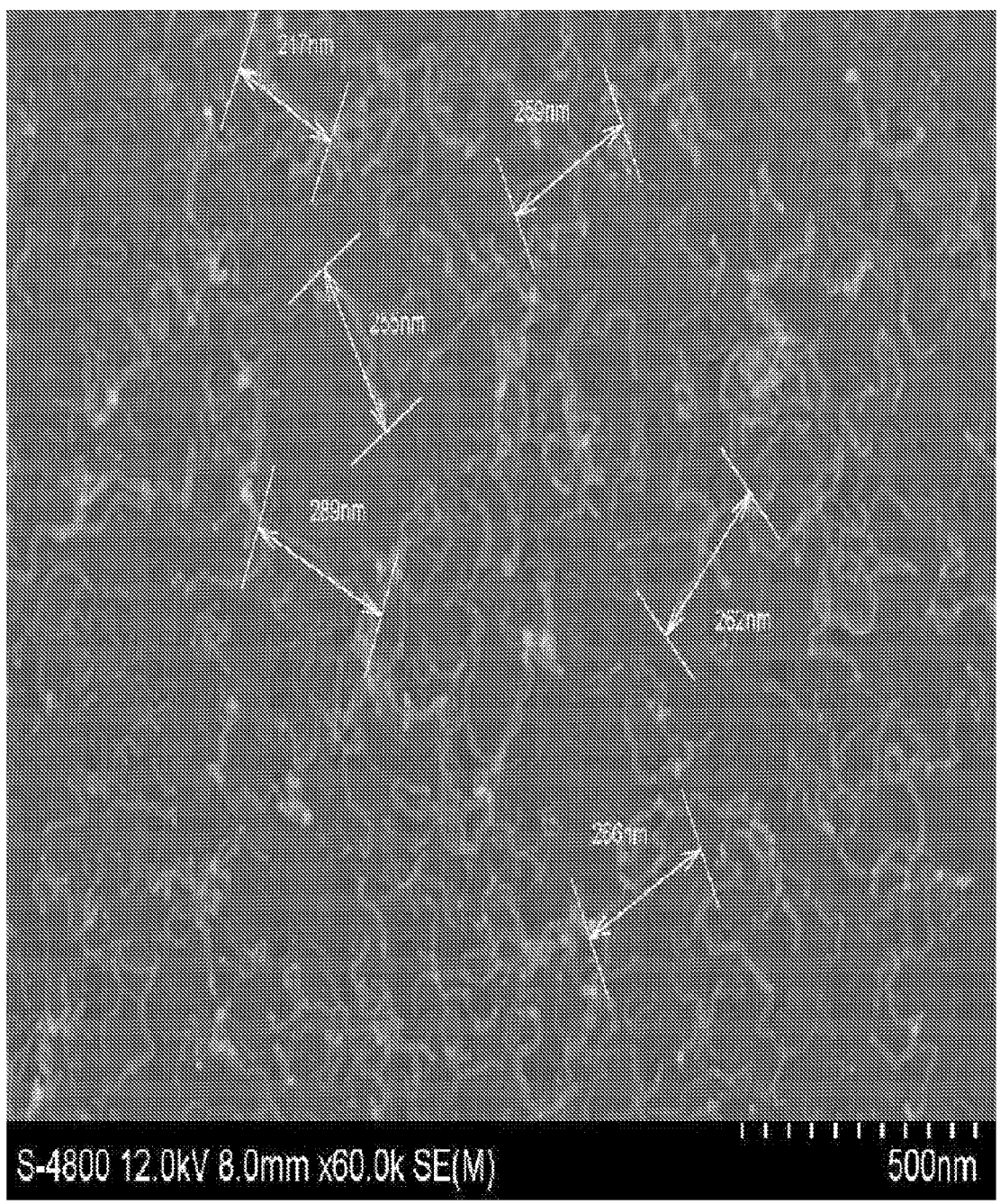
FIG. 8 is a FE-SEM image 8000 of an exemplary pyrolysis product according to an exemplary embodiment.
Figure 9:
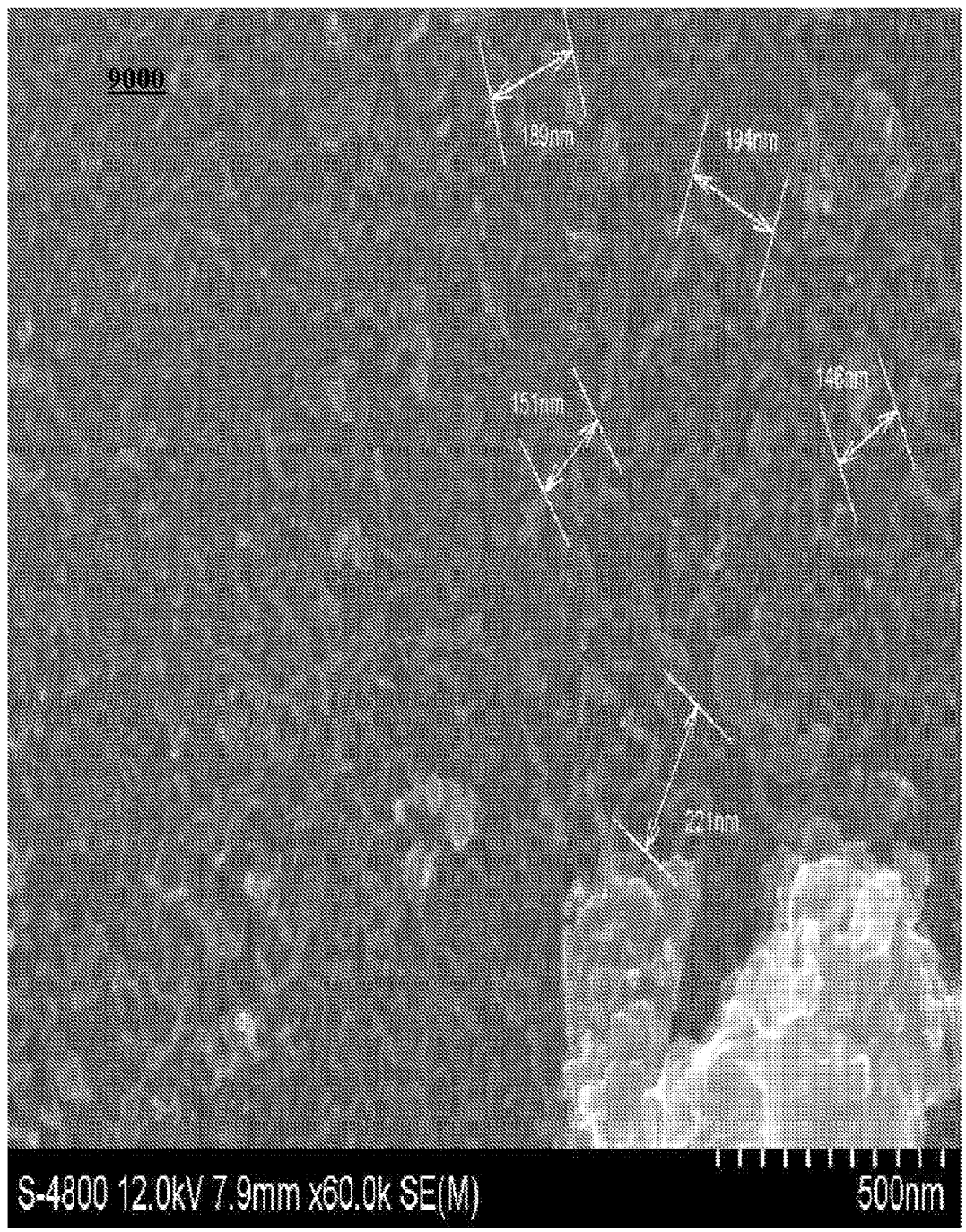
FIG. 9 is a FE-SEM image 9000 of an exemplary pyrolysis product according to an exemplary embodiment.
Figure 10:
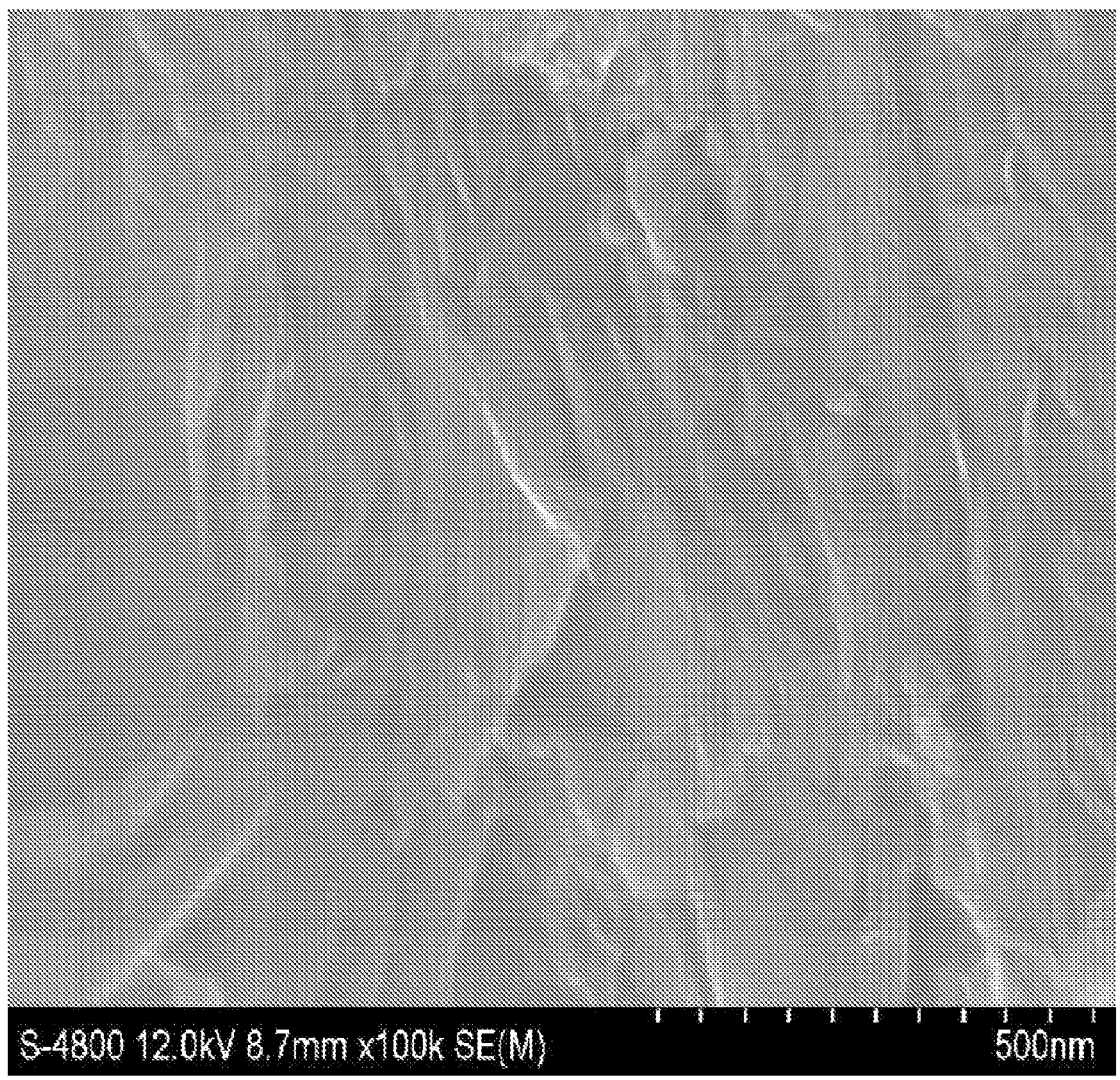
FIG. 10 is a FE-SEM image 10000 of an exemplary pyrolysis product according to an exemplary embodiment.

FIG. 8 is a FE-SEM image 8000 of an exemplary pyrolysis product according to an exemplary embodiment. The pyrolysis products in FIG. 8 were produced with a Fe catalyst with an MS/CS ratio of approximately 0.06. One can see the tubular shape nano carbon. FIG. 9 is a FE-SEM image 9000 of an exemplary pyrolysis product according to an exemplary embodiment. The pyrolysis products in FIG. 9 were produced with a Fe catalyst with an MS/CS ratio of approximately 0.03. One can see more tubular shape nano carbon. FIG. 10 is a FE-SEM image 10000 of an exemplary pyrolysis product according to an exemplary embodiment. The pyrolysis products in FIG. 10 were produced with a Fe catalyst with an MS/CS ratio of approximately 0.16. One can see that substantially no tubular shape nano carbon is present, but can see flakes instead.

Figure 11:
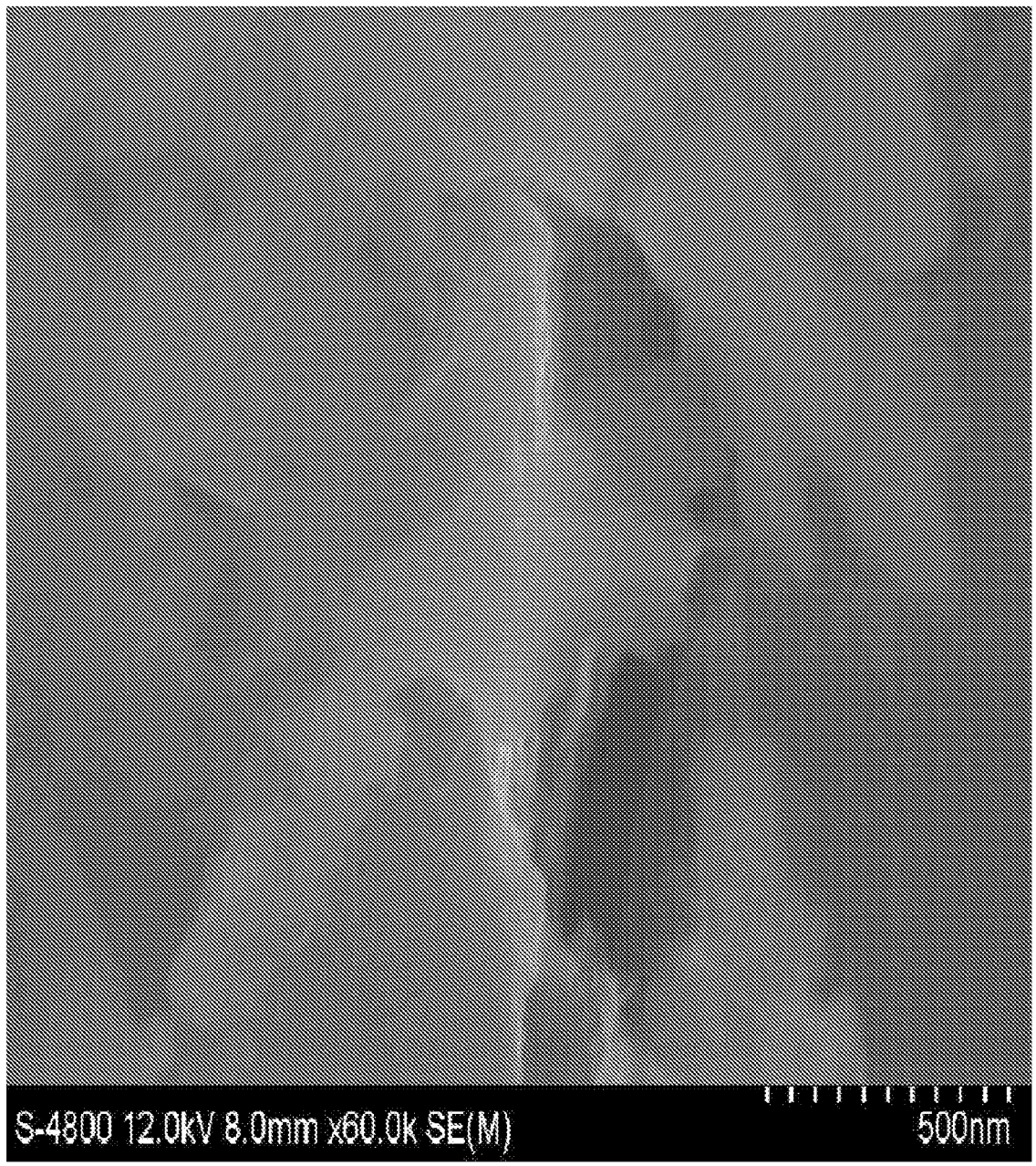
FIG. 11 is a FE-SEM image 11000 of an exemplary pyrolysis product according to an exemplary embodiment.
Figure 12:
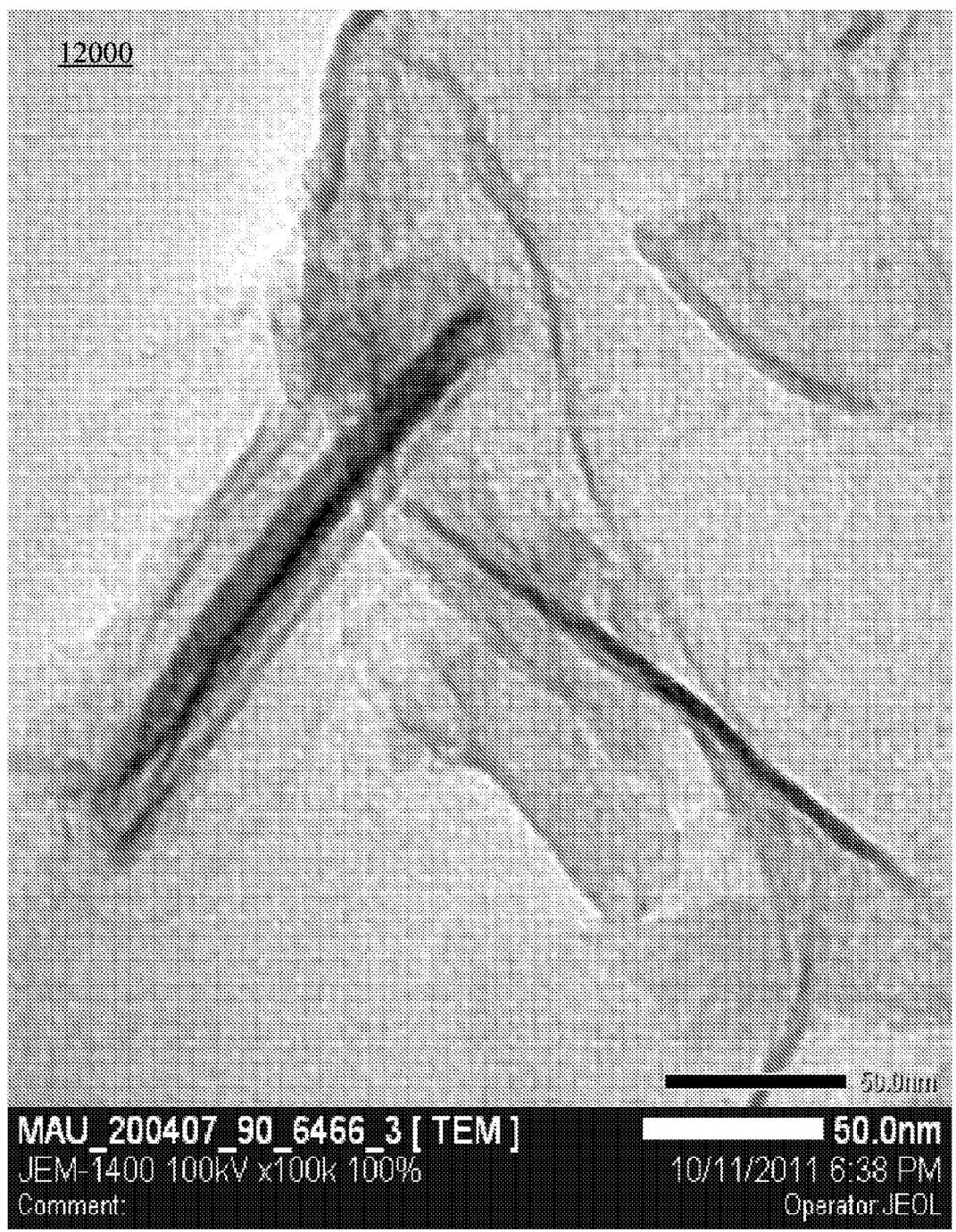
FIG. 12 is a TEM image 12000 of an exemplary pyrolysis product according to an exemplary embodiment.
Figure 13:
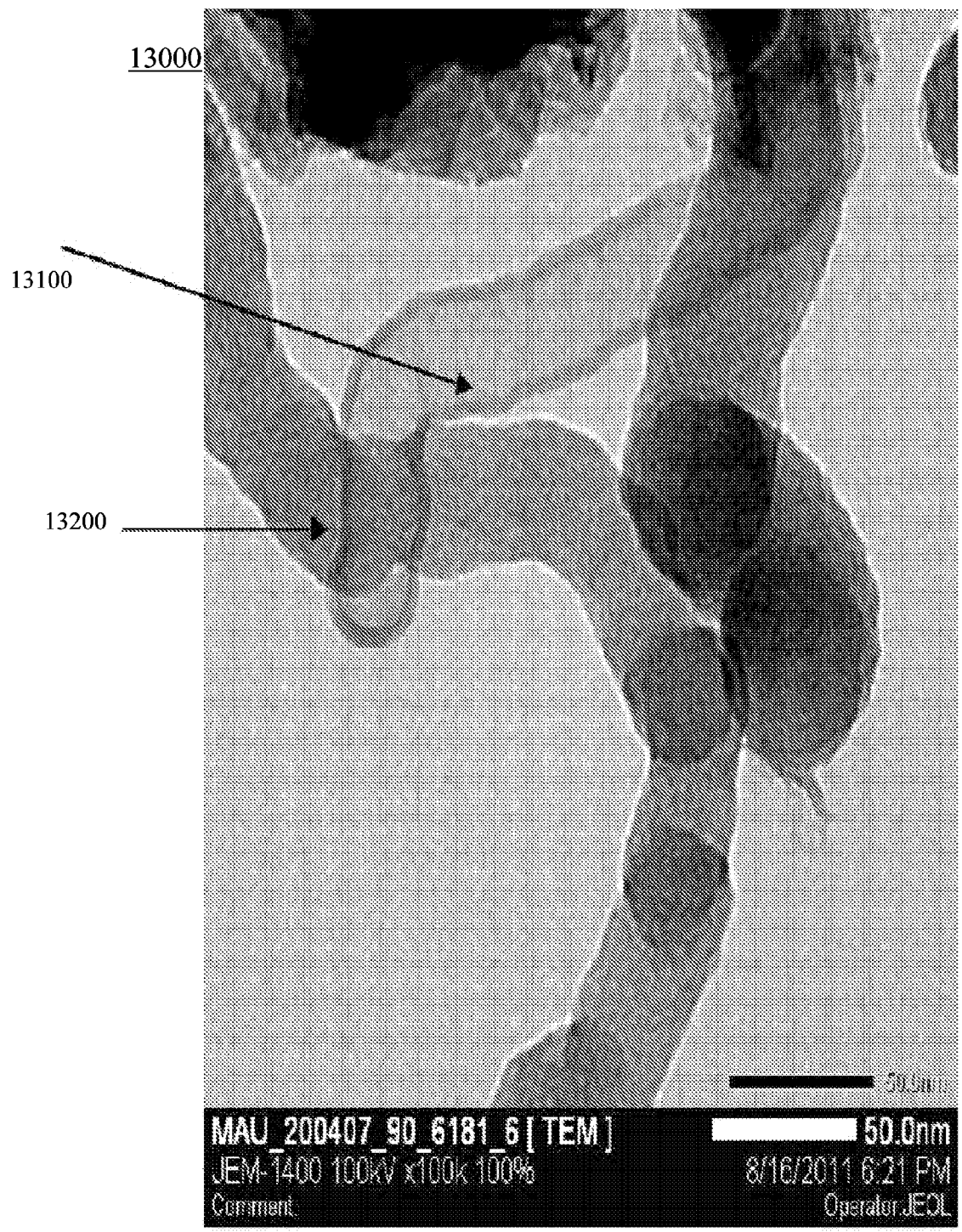
FIG. 13 is a TEM image 13000 of an exemplary pyrolysis product according to an exemplary embodiment.

FIG. 11 is a FE-SEM image 11000 of an exemplary pyrolysis product according to an exemplary embodiment. The pyrolysis products in FIG. 11 were produced with a Fe catalyst with an MS/CS ratio of approximately 2.5. One can see substantially only flake shaped nano carbon. Certain substances were examined via Transmission Electron Microscopy ("TEM"). FIG. 12 is a TEM image 12000 of an exemplary pyrolysis product according to an exemplary embodiment. The pyrolysis products in FIG. 12 were produced with a Fe catalyst with an MS/CS ratio of approximately 0.48. One can see a tubular component and a flake component co-existing. FIG. 13 is a TEM image 13000 of an exemplary pyrolysis product according to an exemplary embodiment. The pyrolysis products in FIG. 13 were produced with a Fe catalyst with an MS/CS ratio of approximately 0.05. The tubular nano carbon shows carbon nano tube 13100, which appears to be substantially hollow; and carbon nano wire and carbon nano rod 13200, which appears to be substantially solid.

Figure 14:
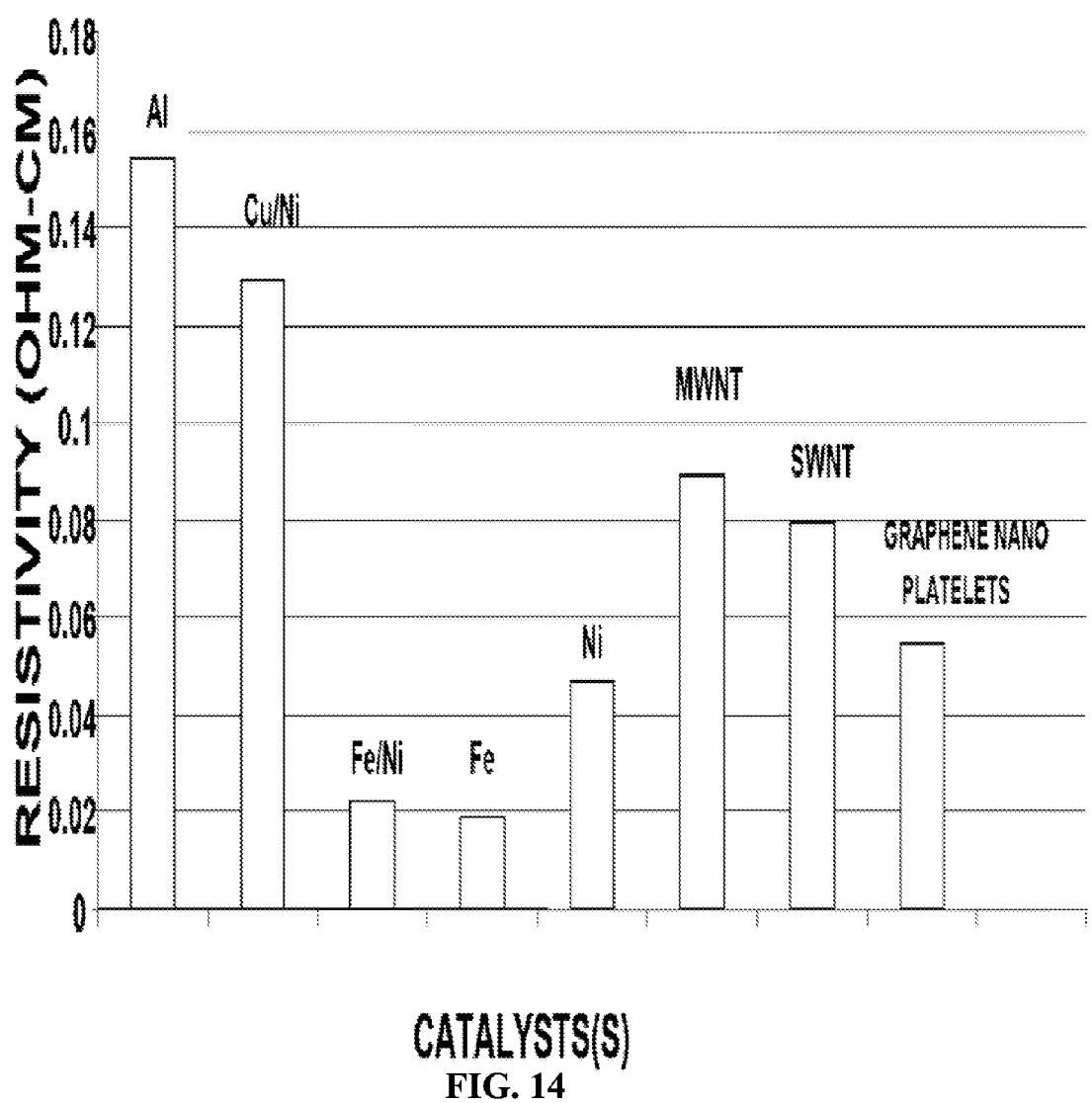
FIG. 14 is a graph 14000 of resistivity values for pyrolysis products of exemplary embodiments produced with different catalysts.

FIG. 14 is a graph 14000 of resistivity values for pyrolysis products of exemplary embodiments produced with different catalysts. FIG. 14 exhibits a comparison effect of various kinds of metal catalyst in the pyrolysis reaction on the electrical resistivity of pyrolysis products. The MS/CS ratio of approximately 0.24 was set for all of experiments. The electrical resistivity of commercially available nano carbon products; single walled nanotubes, multiple walled nanotubes, and graphene nano platelets are shown for reference. The graphene hybrid shows the lowest bulk resistivity with Fe catalyst.

Figure 15:
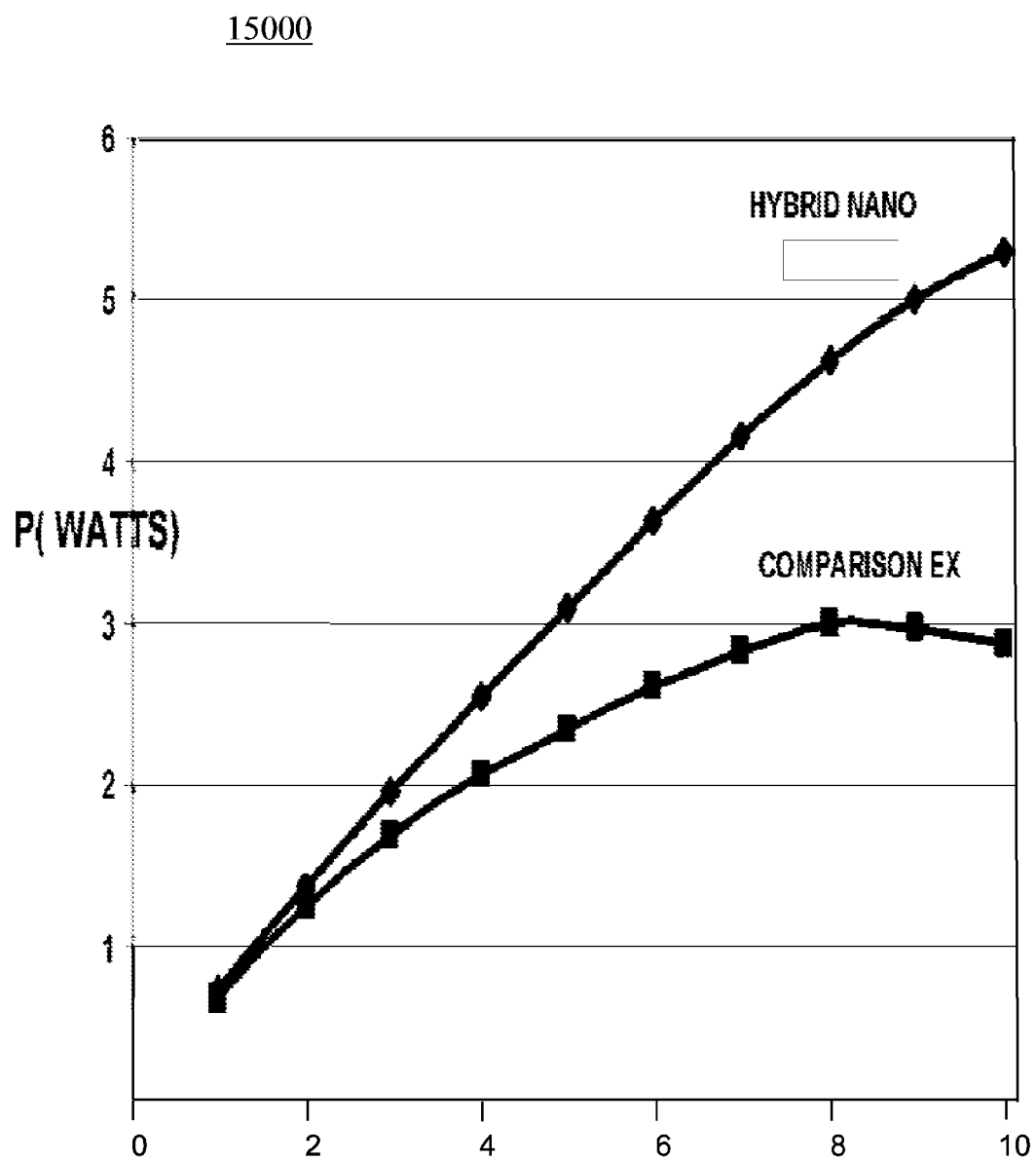
FIG. 15 is a graph 15000 of power values as a function of electrical current for systems using exemplary embodiments.
Figure 16:
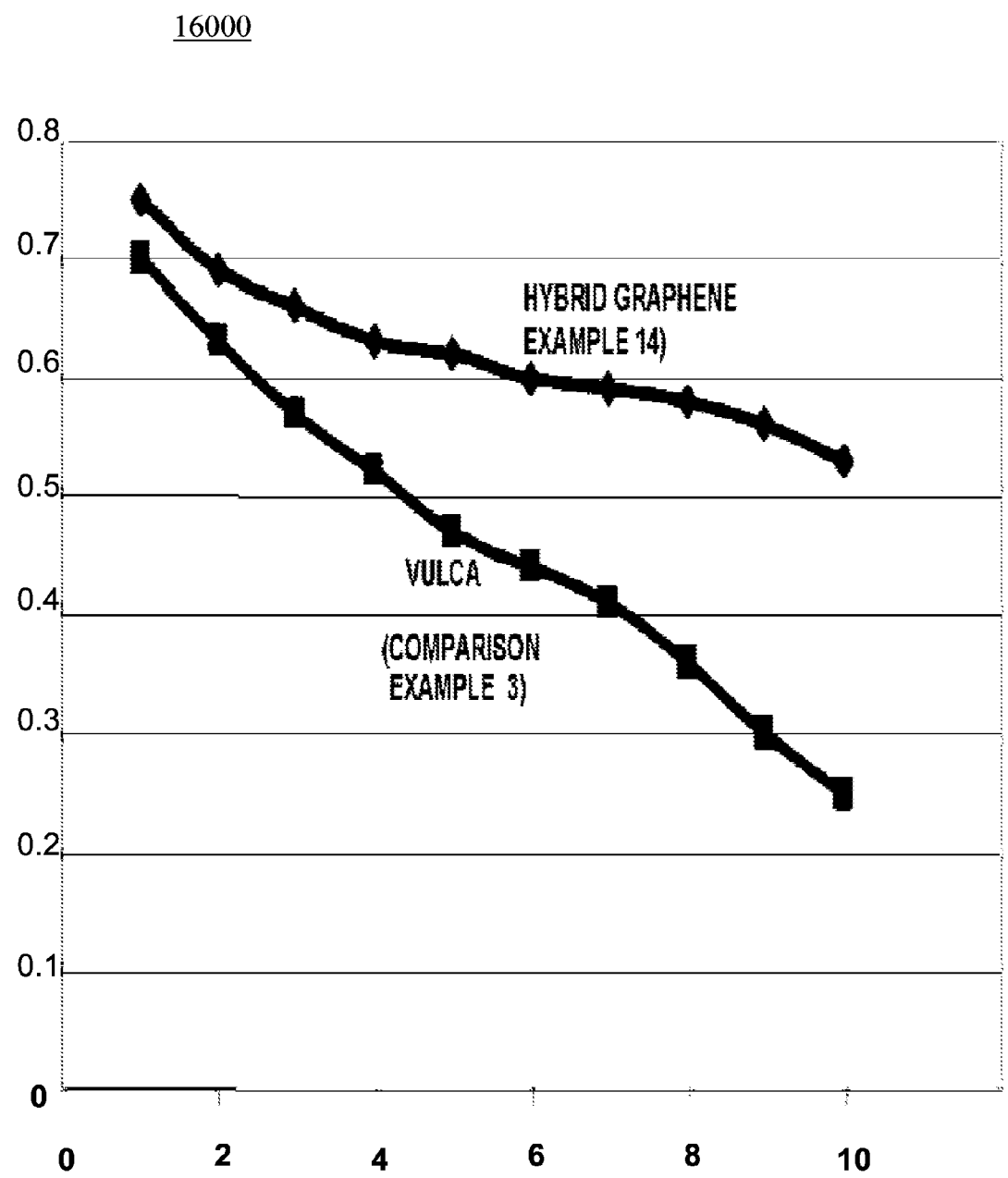
FIG. 16 is a graph 16000 of voltage values as a function of electrical current for systems using exemplary embodiments.

In a Proton Exchange Membrane assembly, a proton transporter, Nafion® film 211 (Nafion is a registered trademark of E.I. DuPont De Nemours and Company and Nafion products can be obtained therefrom), was sandwiched between two different kinds of $H_2$ reducing catalyst over brushed onto gas diffusion materials (Toray Carbon Paper). The active area of the gas diffusion materials was approximately 52.29 $cm^2$. In this case, the cathodic catalyst is composed of Platinum/hybrid graphene in a ratio of approximately 6040 (the hybrid graphene prepared as in Example 1) and an anodic catalyst composed of Platinum Ruthenium/hybrid graphene in relative ratios of approximately 602020 (the hybrid graphene prepared as in Example 1). The system was exposed to an $H_2$ source at a rate of approximately 100 milliliters/minute on the anode site and $O_2$ source at a flow rate of approximately 50 milliliters/minute on the cathode site using a Fuelcell Test Station made by Electrochem, Inc. This experiment was repeated except that hybrid graphene is replaced with Vulcan XR72 from Cabot Corporation. FIG. 15 is a graph 15000 of power values as a function of electrical current for the systems used in these experiments. FIG. 16 is a graph 16000 of voltage values as a function of electrical current for the systems used in these experiments.

Figure 17:
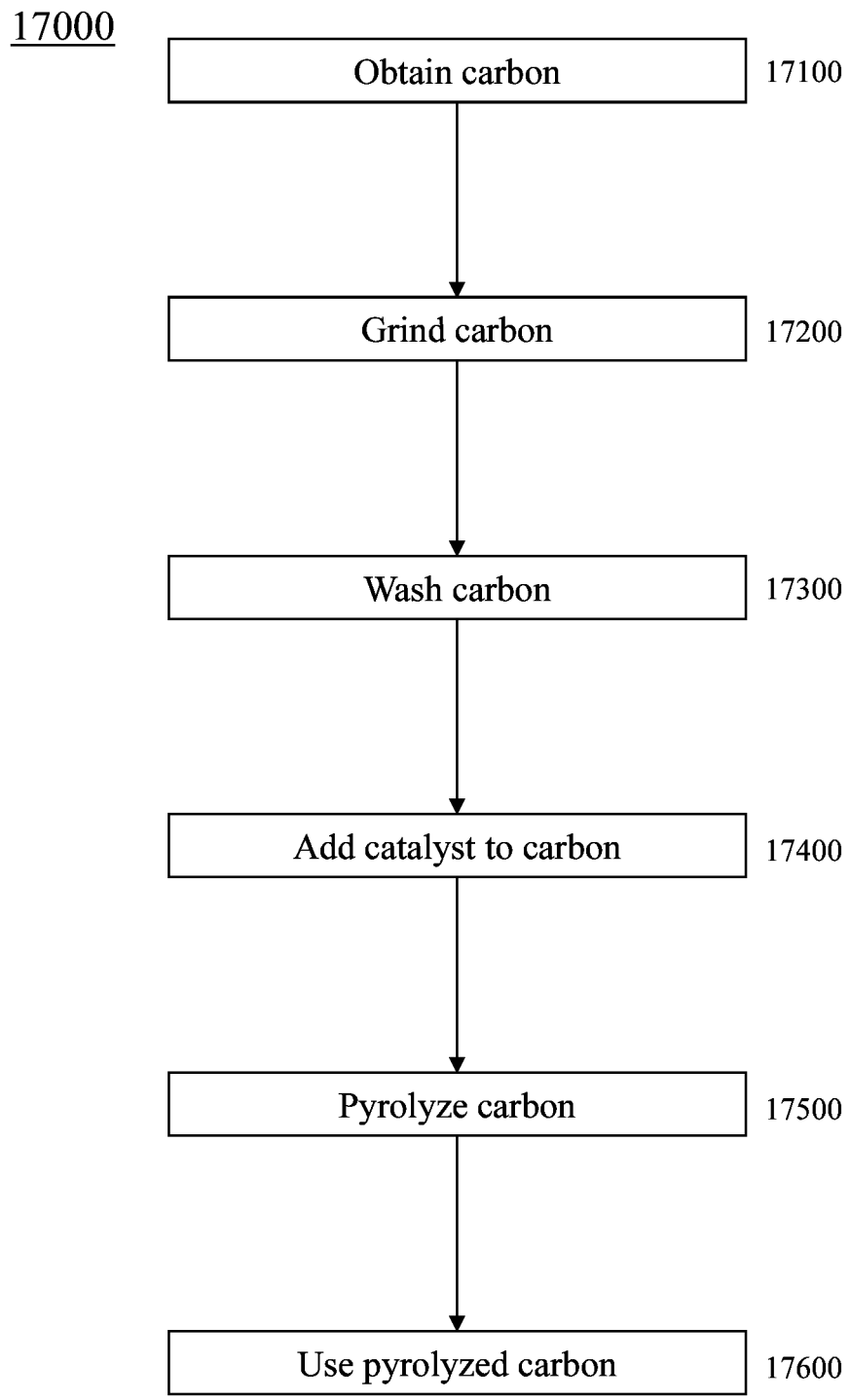
FIG. 17 is a flowchart of an exemplary embodiment of a method 17000.

FIG. 17 is a flowchart of an exemplary embodiment of a method 17000. At activity 17100, carbon can be obtained from a solid carbon source. For example, the solid carbon source can be obtained from one or more of tree woods, beans, cotton, paddy husks, and/or coconut shells, etc. At activity 17200, the solid carbon source can be ground such as via a milling process. In certain exemplary embodiments, the solid carbon source can be salt milled. At activity 17300, the solid carbon source can be washed with a solvent. Via the solvent, soluble substances, such as salt used in grinding the solid carbon source, can be removed from the solid carbon source.

In certain exemplary embodiments, a catalyst comprising iron can be produced. The catalyst can be arranged in a molecule that will not fully adsorb carbon free radicals. Full adsorption can occur when the catalyst molecules are separated from each other due to small MS/CS ratio less than approximately 0.06. Partial adsorption can occur when the MS/CS ratio is greater than approximately 0.1. The greater MS/CS ratio, the tighter the catalyst molecule packing becomes and can be thought of as forming into a catalyst wall where the free radicals of carbon adsorb at substantially one site, and thus grow into a carbon sheet instead of carbon tube. Many approaches of making graphene using graphite oxide as oxide can work as a divider to separate out the carbon sheet. Certain exemplary embodiments use a specific catalyst such as Fe relatives to enhance the adsorption, and use the amount of catalyst (MS/CS greater than approximately 0.10) to form a divider. Salt-milled carbon sources can absorb more catalyst than materials that are not salt milled.

At activity 17400, a catalyst can be added to the solid carbon source. For example, a specific catalyst comprised of at least one component containing iron relatives or a combination of iron relatives with more than one metal component can be used.

At activity 17500, the solid carbon source can be pyrolyzed to form a hybrid composite. In certain exemplary embodiments, the solid carbon source can be pyrolyzed in an oven, via plasma chemical vapor deposition, and/or via thermal chemical vapor deposition, etc. The catalyst can be adapted to, when present with a milled solid carbon source in pyrolysis in an unoxidizing environment, produce a hybrid composite comprising tubular carbon and graphene. In certain exemplary embodiments, the hybrid composite can comprise tubular carbon and a graphene flake. In certain exemplary embodiments, the tubular carbon can be a carbon nanotube, a carbon nanorod, a carbon nanofiber, and/or a carbon nanowire. In certain exemplary embodiments, the tubular carbon can be between approximately 0.01% and approximately 99% of the hybrid composite. In certain exemplary embodiments, the hybrid composite can be produced via pyrolysis of a milled solid carbon source under an unoxidizing environment. When analyzed via X-ray diffraction, the hybrid composite can generate peaks at two theta values of approximately 26.5 degrees, approximately 42.5 degrees, and approximately 54.5 degrees.

In certain exemplary embodiments, the graphene flake, when analyzed via X-ray diffraction, generates peaks at two theta values of approximately 26.5 degrees and approximately 54.5 degrees. In certain exemplary embodiments, the tubular carbon, when analyzed via X-ray diffraction, generates peaks at two theta values of approximately 44.5 degrees and approximately 51.6 degrees.

At activity 17600, the pyrolyzed carbon can be used in any of a variety of applications. For example, a system can be produced that comprises the hybrid composite. The hybrid composite can comprise tubular carbon and a graphene flake. The hybrid composite can be present in the system in at least one of: conductive paint, conductive lacquer, electromagnetic shielding, conductive ink adapted for use in printed electronics, a conductor adapted for use in a light emitting diode, a conductor adapted for use in a solar cell, an electrical conductor adapted for use in a battery electrode, an electrical conductor, a bipolar plate adapted for use in a fuel cell, an electrocatalyst adapted for use in a fuel cell, a charge transport element or a charge generation element adapted for use in a solar cell, a photoconductor, a transistor, a biosensor, a glucose meter, and/or an alcohol detector, etc.

In certain exemplary embodiments, the hybrid composite can be blended with a solvent, a metal, a ceramic, a plastic, an oxide, a nitride, and/or a material comprising carbon, etc.

Certain exemplary embodiments provide a system comprising a device comprising a hybrid composite. The hybrid composite can be present in at least one of conductive paint, conductive lacquer, electromagnetic shielding, conductive ink adapted for use in printed electronics, a conductor and/or transparent conductor adapted for use in an LED, a conductor and/or transparent conductor adapted for use in a solar cell, an electrical conductor adapted for use in a battery electrode, an electrical conductor, a bipolar plate adapted for use in a fuel cell, an electrocatalyst adapted for use in a fuel cell, a charge transport element and/or charge generation element adapted for use in a solar cell, a photoconductor, a transistor, a biosensor, a glucose meter, and/or an alcohol detector, etc. The hybrid composite can comprise tubular carbon and graphene produced via pyrolysis of a milled solid carbon source under an unoxidizing environment. When analyzed via X-ray diffraction, the hybrid composite can generate peaks at two theta values of approximately 26.5 degrees, approximately 42.5 degrees, and approximately 54.5 degrees.

DEFINITIONS

When the following terms are used substantively herein, the accompanying definitions apply. These terms and definitions are presented consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.
activity—an action, act, step, and/or process or portion thereof.
adapted to—made suitable or fit for a specific use or situation.
adsorb—to adhere to a surface.
alcohol detector—a device and/or system adapted to identify, qualitatively and/or quantitatively, the presence of an organic compound comprising a hydroxyl functional group (—OH) that is bound to a carbon atom.
and/or—either in conjunction with or in alternative to.
apparatus—an appliance or device for a particular purpose.
battery—one or more electrochemical cells adapted to convert stored chemical energy into electrical energy.
battery electrode—an electrical conductor used to make contact with a nonmetallic part of an electrochemical cell, wherein the electrochemical cell is adapted to convert chemical energy to electrical energy.
biosensor—an analytical device for the detection of an analyte that combines a biological component with a physicochemical detector component.
bipolar plate—conductive plate in a fuel cell stack that acts as an anode for one cell and a cathode for an adjacent cell. The plate can comprise a metal or a conductive polymer (which can be a carbon-filled composite).
blend—to mix together.
can—is capable of, in at least some embodiments.
carbon nanofiber—a substantially cylindrical nanostructure with graphene layers arranged as stacked cones, cups, or plates.

carbon nanorod—a nanocrystalline form of diamond.

carbon nanotube—a Carbon nanofiber comprising graphene layers wrapped into substantially perfect cylinders.

carbon nanowires—a nanostructure comprising carbon and having a diameter of approximately a nanometer ($10^{-9}$ meters) and in which electrons are quantum confined laterally.

ceramic—an inorganic, nonmetallic solid.

charge generation element—a substance adapted to, responsive to incident light, induce a charge separation of electron-hole pairs across various layers of a multiple layer device.

charge transport element—a substance adapted to conduct holes from a charge generating substance to a charge receiving substance.

composite—a material comprising at least two constituents at the nanometer or molecular level.

comprising—including but not limited to.

conduct—to transmit electrical energy.

conductive—adapted to transmit electrical energy.

conductive polymer—an organic polymer adapted to conduct electricity.

couple—to join, connect, fasten, link, and/or associate together.

device—a machine, manufacture, and/or collection thereof.

dispersion film—the thin layer made by vacuum sublimation process or coating deposited on a substrate from a solution.

electrical conductor—a substance adapted to transmit electrical energy.

electrocatalyst—a material adapted to increase the rate of a chemical reaction at an electrode surface without being consumed by the chemical reaction.

electromagnetic shielding—a barrier, made of conductive and/or magnetic materials, adapted to reduce an electromagnetic field in a space by blocking the field.

fabricate—to construct.

flake—a substantially planar lattice of carbon atoms.

fuel cell—a system adapted to convert chemical energy from a fuel into electricity through a chemical reaction with oxygen or another oxidizing agent.

full adsorption—a state when free radicals generated from solid carbon sources under a thermal decomposition reaction (pyrolysis) substantially completely adsorb onto the surface of a catalyst molecule and grow into a tube shape.

functionalized graphene—graphene derivatives that carry functional groups to improve the compatibility of graphene with other materials such as polymers and/or solvents, etc.

generate—to produce.

glucose meter—a device and/or system adapted for determining an approximate concentration of glucose in blood.

graphene—an allotrope of carbon having a structure of approximately one-atom-thick planar sheets of sp2-bonded carbon atoms in a honeycomb crystal lattice.

graphene/superconductor composite—a composite comprising a graphene layer deposited onto a substrate; the substrate comprising a superconductor of a form $Y_xBa_yCu_zO_t$, where Y denotes yttrium, Ba denotes barium, Cu denotes copper, O denotes oxygen, and the subscripts x, y, z, and t are integers denoting elemental quantities present in the superconductor; e.g., $YBa_2Cu_3O_7$.

hybrid composite—a material comprising two constituents at the nanometer or molecular level.

hybrid graphene—a material comprising graphene and at least one other constituent that have been combined at the nanometer or molecular level.

ink—a liquid or paste that contains pigments and/or dyes adapted to produce electrically conductive patterns when used in a suitable system.

iron relative—a compound comprising at least one of iron inorganic salts, iron organic salts, iron chelates, iron organo metallic compounds.

lacquer—a varnish that dries by solvent evaporation and/or a curing process to produce a relatively durable finish.

light amplification element—a substance and/or system adapted to increase the effect of physical change or chemical change caused by the photon energy.

light emitting diode—a semiconductor diode that emits photons responsive to a flow of electrical current.

light energy—electromagnetic radiation to which the organs of sight react, ranging in wavelength from approximately 400 nanometers to approximately 700 nanometers.

light induced physical change—a process wherein an electron-hole pair is generated responsive to photon energy.

light-induced chemical change—a process wherein an electron-proton pair is generated responsive to photon energy.

may—is allowed and/or permitted to, in at least some embodiments.

method—a process, procedure, and/or collection of related activities for accomplishing something.

nano carbon—carbon materials having average particle size less than approximately 100 nanometers, which can be bonded at the molecular level in differing ways to achieve unique properties; e.g., nanotubes, buckytubes, and/or fullerenes, etc.

nano rod—a nanocrystalline form of carbon having rod shape in nano scale (less than approximately 100 nanometers).

nano silver derivative particles—nano substances comprising silver; for example AgCl, AgBr, AgI, AgF, Ag2S, and Ag2Se, etc. are silver derivatives.

nano silver particles—crystalline silver having a nano scale size.

nano wire—a nanostructure in which electrons are quantum confined laterally, which has a diameter of less than approximately 100 nanometers and length less than approximately 100 nanometers; Si nano wire, carbon nano wire, and ZnO nano rod are examples of nano wire.

nano-platelets—nanoparticles comprising stacks of graphene that are 1 to 15 nanometers thick, with diameters ranging from sub-micrometer to 100 micrometers.

nitrile—a compound of nitrogen where nitrogen has a formal oxidation state of −3.

obtain—to come into possession of, get, acquire, and/or procure.

operatively—in a manner adapted to achieve an effective and/or desired result.

optically transparent—adapted to allow light energy to pass through without any substantial attenuation.

organic dye—organic molecules of colored substance that have an affinity to a substrate to which it is applied.

organic photoconductor—an organic molecule and electrical resistor whose resistance changes with increasing incident light intensity.

organic pigment—an organic molecule and/or carbon-based material that changes a color of reflected or transmitted light as a result of wavelength-selective absorption.

oven—a chamber used adapted for heating a substance.

oxidation agent—an element or compound in a reduction-oxidation (redox) reaction that accepts an electron.

oxide—a chemical compound that contains at least one oxygen atom in its chemical formula.

photo detector—a sensor of light or other electromagnetic energy.

photo fuel cell—a system adapted to produce electricity by a photocatalytic process.

photo resistor—a material whose resistance decreases with increasing incident light intensity.

photoconductor—a material whose resistance changes with increasing incident light intensity.

photographic developer—a chemical that makes a latent image on a film or print visible via a chemical reduction reaction.

photographic dyestuff—a substance that can be used as a dye or from which a dye can be obtained, wherein the dye is adapted for use in photographic applications.

photovoltaic polymer—polymers adapted for use in a photovoltaic cell.

plasma chemical vapor deposition—a process adapted to deposit relatively thin films from a gas state to a solid state on a substrate. Chemical reactions are involved in the process, which occur after creation of a plasma of the reacting gases.

platelets—a minute flattened body less than approximately ten microns in size.

polymer—a chemical compound or mixture of compounds formed by polymerization and comprising repeating structural units.

polymeric binder—a substance adapted to restrain a polymer from dissociating.

present—being in a specified thing.

printed electronics—components produced via a method wherein electrically functional electronic or optical inks are deposited on the substrate, to create active or passive devices, such as thin film transistors or resistors.

produce—to make or manufacture.

provide—to furnish, supply, give, and/or make available.

pyrolysis—a thermochemical decomposition of organic material at a temperature above approximately 200 degrees Celsius in the substantial absence of oxygen.

pyrolyze—to thermochemically decompose an organic material at a temperature above approximately 200 degrees Celsius in the substantial absence of oxygen.

reducing agent—an element or compound in a reduction-oxidation (redox) reaction that donates an electron.

salt—any of a class of compounds formed by the replacement of one or more hydrogen atoms of an acid with elements or groups, which are composed of anions and cations.

salt mill—to reduce a particle size of a solid via attrition via a medium comprising a salt.

semi-conducting—having a conductivity roughly in the range of $10^3$ to $10^{-8}$ siemens per centimeter.

semiconductor—a substance, such as silicon or germanium, with electrical conductivity intermediate between that of an insulator and a conductor.

solar cell—a solid state system that converts light energy directly into electricity via the photovoltaic effect.

solid carbon source—an organic substance that is in a physical state in which it resists changes in size and shape.

solvent—a substance adapted to dissolves another solid, liquid, or gaseous solute.

substantially—to a great extent or degree.

substrate—a supporting material on which a circuit is formed or fabricated.

supercapacitor—an electrochemical capacitor with relatively high energy density on the order of hundreds of times greater than conventional electrolytic capacitors.

system—a collection of mechanisms, devices, machines, articles of manufacture, processes, data, and/or instructions, the collection designed to perform one or more specific functions.

thermal chemical vapor deposition—a process in which a substrate is exposed to one or more heated volatile precursors, which react and/or decompose on the substrate surface to produce a deposit.

thin film—a layer of material ranging from fractions of a nanometer (monolayer) to several micrometers in thickness.

transistor—a semiconductor device comprising at least three terminals and adapted to amplify and/or switch electronic signals and power.

transparent conductor—a substance that is substantially optically transparent and electrically conductive.

tubular—having a substantially cylindrical shape.

two theta values—detected intensities of an X-ray beam at a given detector swing angle (the detector swing angle of an X-ray diffraction system is defined as "two theta").

unoxidizing environment—an atmosphere substantially devoid of reactive oxygen.

via—by way of and/or utilizing.

via—by way of and/or utilizing.

X-ray diffraction—a substantially non-destructive analytical technique adapted to determine information about crystallographic structure, chemical composition, and/or physical properties of materials based on detecting reflected intensities of X-ray beans at predetermined angels of incidence (theta).

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, description, abstract, drawing figure, etc.) of this application, unless clearly specified to the contrary, such as via explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

no characteristic, function, activity, or element is "essential";

any elements can be integrated, segregated, and/or duplicated;

any activity can be repeated, any activity can be performed by multiple entities, and/or any activity can be performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

When any claim element is followed by a drawing element number, that drawing element number is exemplary and non-limiting on claim scope. No claim of this application is intended to invoke paragraph six of 35 USC 112 unless the precise phrase "means for" is followed by a gerund.

Every portion (e.g., title, field, background, summary, description, abstract, drawing figure, etc.) of this application, other than the claims themselves, is to be regarded as illustrative in nature, and not as restrictive, and the scope of subject matter protected by any patent that issues based on this application is defined only by the claims of that patent.

What is claimed is:

1. A method comprising a plurality of activities, comprising:

fabricating a system, said system comprising a light amplification element and a charge transport element, said light amplification element comprising at least one of a light induced physical change element and a light-induced chemical change element, each of said light amplification element and said charge transport element comprising one or more of a graphene layer, graphene oxide, graphene nano platelets, functionalized graphene, a graphene hybrid composite, graphene/superconductor composite, tubular shaped nano carbon, semiconductor powder, thin film, nano wire, and nano rod, said graphene layer having a thickness that is between 0.1 nanometer and 50 micrometers, said charge transport element comprising at least one of a composite of hybrid graphene, a composite of graphene nano platelets, and a polymer, when exposed to light energy, said system adapted to undergo at least one of:

a light induced physical change in which an electron-hole pair is generated and separated into a substantially free electron and a substantially free hole; and a light-induced chemical change in which an electron-proton pair is generated and separated into a substantially free proton and substantially free electron;

wherein said light amplification element is adapted to:
adsorb light energy,
generate said electron-hole pair or said electron-proton pair;
generate a plurality of free electrons, free holes, or free protons from an absorbed single photon; and
via at least one of reducing agent or oxidizing agent, repeatedly perform a process described in Model 1 or Model 2:
in which M is a metal, H is hydrogen, R is a compound comprising one or more of Cl, Br, I, F, alkyl, alkenes, phenyl, aryl, alkenyl, and arylalkane, said arylalkane comprising at least one substitute group selected from —OH, —COOH, —SO3H, —SH, —NO$_2$, —CN, —SO$_3$H, —NR1R2, —CH$_2$OH, —SO$_2$, and —SO$_2$Cl.

2. The method of claim 1, further comprising:

adding at least one of nano silver particles, nano silver derivative particles, a photographic developer, oxidizing agent, and reducing agent to said light amplification element.

3. The method of claim 1, further comprising:

adding at least one of nano silver particles, nano silver derivative particles, and photographic dyestuff to said light amplification element.

4. The method of claim 1, further comprising:

adding at least one of nano silver particles, nano silver derivative particles, photographic dyestuff a photographic developer, and an oxidation agent to said light amplification element.

5. The method of claim 1, further comprising:

adding nano silver derivative particles to said light amplification element.

6. The method of claim 1, further comprising:

adding particles comprising silver to said light amplification element.

7. The method of claim 1, wherein:

said light amplification element comprises semiconductor compounds in the form of at least one of a thin film, a dispersion film, and a composite.

8. The method of claim 1, wherein:

said light amplification element is an organic photoconductor.

9. The method of claim 1, wherein:

said light amplification element comprises at least one of organic pigments, organic dyes, conductive polymers, and photovoltaic polymers.

10. The method of claim 1, wherein:

said light amplification element comprises a polymeric binder.

11. The method of claim 1, wherein:

said light amplification element comprises a polymeric binder, said polymeric binder comprising at least one of gelatin, poly amino acids, polyurethane, polyamides, polyimide, water soluble polymers, water insoluble polymers, emulsion polymers, cross linking polymers, nata de coco, and hemicelluloses binder, conductive polymers, photovoltaic polymers.

12. The method of claim 1, further comprising:

operatively coupling said light amplification element to at least one of an electron donor, reduction agent, hole transport molecules, an electron acceptor, oxidation agent, and electron transport molecules.

13. The method of claim 1, wherein:

said light amplification element comprises at least one of organic pigments and organic dyes, said at least one of organic pigments and organic dyes comprising at least one of silver and silver derivatives.

14. The method of claim 1, wherein:

said system is adapted for use in at least one of a solar cell, photo detector, photoconductor, photo-fuel cell, a light emitting diode, and electrical power generation.

15. The method of claim 1, wherein:
said system is intercalated between a first electrode and a second electrode that is a substantially optically transparent electrical conductor.

16. The method of claim 1, wherein;
said system is located on an electrical conductive substrate.

17. The method of claim 1, wherein:
said system is intercalated between a first electrode and a second electrode that is a substantially optically transparent electrical conductor, said optically transparent electrical conductor comprising graphene.

18. The method of claim 1, wherein:
electrical signals passing through said system are electrically coupled to a capacitor and supercapacitor.

19. A system comprising:
a light amplification element and a charge transport element, said light amplification element comprising at least one of a light induced physical change element and a light-induced chemical change element, each of said light amplification element and said charge transport element comprising one or more of a graphene layer, graphene oxide, graphene nano platelets, functionalized graphene, a graphene hybrid composite, graphene/superconductor composite, tubular shape nano carbon, semiconductor powder, thin film, nano wire, nano rod, said graphene layer having a thickness that is between 0.1 nanometer and 50 micrometers, said charge transport element comprising at least one of a composite of hybrid graphene, a composite of graphene nano platelets, a polymer, when exposed to light energy, said solar cell adapted to undergo at least one of:
a light induced physical change in which an electron-hole pair is generated and separated into a substantially free electron and a substantially free hole; and
a light-induced chemical change in which an electron-proton pair is generated and separated into a substantially free proton and substantially free electron;
wherein said light amplification element is adapted to:
adsorb photon energy;
generate said electron-hole pair or said electron-proton pair, and
multiply a plurality of free electrons, free holes, or free protons from an absorbed single photon;
via at least one of reducing agent or oxidizing agent, repeatedly perform a process described in Model 1 and Model 2:
in which M is a metal, H is hydrogen, R is a compound comprising one or more of Cl, Br, L F, alkyl, alkenes, phenyl, aryl, alkenyl, and arylalkane, said arylalkane comprising at least one substitute group selected from —OH, —SH, —COOH, —NO2, —CN, —SO3H, —NR1R2, —RCH2OH, —SO2, —SO2Cl.

* * * * *